United States Patent [19]
Friedman et al.

[11] Patent Number: 6,163,174
[45] Date of Patent: Dec. 19, 2000

[54] DIGITAL BUFFER CIRCUITS

[75] Inventors: Eby Friedman; Radu M. Secareanu, both of Rochester, N.Y.

[73] Assignee: The University of Rochester, Rochester, N.Y.

[21] Appl. No.: 09/318,421

[22] Filed: May 25, 1999

Related U.S. Application Data

[60] Provisional application No. 60/086,711, May 26, 1998.

[51] Int. Cl.[7] .................................................... G11C 8/00
[52] U.S. Cl. .............................. 326/108; 326/83; 326/86
[58] Field of Search ................................. 326/17, 83, 86, 326/87, 112, 119, 121, 108

[56] References Cited

U.S. PATENT DOCUMENTS

| | | |
|---|---|---|
| 4,612,466 | 9/1986 | Stewart . |
| 4,789,793 | 12/1988 | Ehni et al. . |
| 4,992,676 | 2/1991 | Gerosa et al. . |
| 4,992,677 | 2/1991 | Ishibashi et al. . |
| 5,061,864 | 10/1991 | Rogers . |
| 5,111,075 | 5/1992 | Ferry et al. . |
| 5,231,311 | 7/1993 | Ferry et al. . |
| 5,329,175 | 7/1994 | Peterson . |
| 5,367,205 | 11/1994 | Powell . |
| 5,424,653 | 6/1995 | Folmsbee et al. . |
| 5,483,177 | 1/1996 | Van Lieverloo . |
| 5,541,527 | 7/1996 | Hae-ting Ma .............................. 326/21 |
| 5,629,634 | 5/1997 | Carl et al. .................................. 326/27 |
| 5,717,343 | 2/1998 | Kwong . |
| 5,739,707 | 4/1998 | Barraclough . |
| 5,850,159 | 12/1998 | Chow et al. ............................. 327/394 |
| 5,914,618 | 6/1999 | Mattos ....................................... 326/87 |

OTHER PUBLICATIONS

Sakurai et al., "Alpha–Power Law MOSFET Model and its Applications to CMOS Inverter Delay and Other Formulas", IEEE Journal of Solid–State Circuits, vol. 25, No.2, pp. 584–594, Apr. 1990.

Lin et al., "An Optimized Output Stage for MOS Integrated Circuits", IEEE Journal of Solid–State Circuits, vol. SC–10, No. 2 pp. 106–109, Apr. 1975.

Hedenstierna et al., "CMOS Circuit Speed and Buffer Optimization", IEEE Transactions on Computer Aided Design, vol. CAD–6, No. 2, pp. 270–281, Mar. 1987.

Li et al., "CMOS Tapered Buffer", IEEE Journal of Solid–State Circuits, vol. 25, No. 4, pp. 1005–1008, Aug. 1990.

Dhar et al. "Optimum Buffer Circuits for Driving Long Uniform Lines", IEEE Journal of Solid–State Circuits, vol. 26, No. 1, pp. 32–40, Jan. 1991.

Cherkauer et al. "A Unified Design Methodology for CMOS Tapered Buffers", IEEE Transactions on VLSI Systems, vol. VLSI–3, No. 1, pp. 99–111, Mar. 1995.

Cherkauer et al., "Design of Tapered Buffers with Local Interconnect Capacitance", IEEE Journal of Solid–State Circuits, vol. 30, No. 2, pp. 151–155, Feb. 1995.

(List continued on next page.)

*Primary Examiner*—Michael Tokar
*Assistant Examiner*—Anh Tran
*Attorney, Agent, or Firm*—Kenneth J. Lukacher

[57] ABSTRACT

CMOS buffer circuits are provided having multiple stages of driving transistors defining a fast "1" data path and a fast "0" data path for transmitting data signals from the input to output of the buffer. Each stage before the last stage in each of the data paths has at least one nulling transistor coupled to the driving transistor of the stage. Separate from the data paths, the nulling transistors of each data path are operated to synchronously null the driving transistors of the data path to prepare such driving transistors for the next fast transition in the input data signal. Another nulling transistor may be also coupled to the driving transistor of each stage before the last stage of each data path which prevents the data path from floating when the data path is not transmitting a transition of the input signal to output of the buffer. The CMOS buffer circuits are suitable for driving large capacitive loads optimally over any range of input signal frequency, restoring slow transitioning digital signals, or driving highly resistive RC interconnect lines.

45 Claims, 21 Drawing Sheets

OTHER PUBLICATIONS

Hodges et al., "Analysis and Design of Digital Integrated Circuits", Chpt. 3, pp. 56–65, McGraw–Hill, Inc. 1988.

Rabaey, Jan M., "Digital Integrated Circuits", Prentice Hall, pp. 39–461.

Huang et al, "Feedback–Controlled Split–Path CMOS Buffer", IEEE International Symposium on Circuits and Systems, vol. 4, pp.300–303, 1996.

Bowhill et al., "Circuit Implementation of a 300MHz 64–bit Second–generation CMOS Alpha CPU." Digital Technical Journal, vol. 7, No. 1, pp. 100–118, 1995.

DIGITAL BUFFER CIRCUITS

DESCRIPTION

This application claims the benefit of priority to U.S. Provisional Application Serial No. 60/086,711, filed May 26, 1998.

FIELD OF THE INVENTION

The present invention relates to high speed CMOS buffer circuits for transmitting data signals from the input to the output of a buffer, and particularly to high speed CMOS buffer circuits capable of driving large capacitive loads, restoring slow transitioning digital signals, or driving highly resistive RC interconnect lines. The CMOS buffer circuits of the invention are especially useful in digital integrated circuits.

BACKGROUND OF THE INVENTION

CMOS technology is conventionally used to implement digital integrated circuits. Often CMOS circuits drive large capacitive loads. Such capacitive loads may occur due to on-chip interconnections, output pads, or off-chip loads. The CMOS circuit commonly used for driving large capacitive loads is the tapered buffer. A typical digital three stage tapered buffer or amplifier chain is shown in FIG. 1. An input data signal Vin is amplified by the three CMOS inverter stages to the final output node Vout. Each of the stages of the buffer circuit consists of a PMOS pull-up transistor P coupled to the high potential power rail $V_{dd}$, an NMOS pull-down transistor N coupled to the low potential power rail GND, an input terminal that connects the gates of the N and P transistors, and an output terminal between the P and N transistors connected to the input terminal of the next stage.

A transition from logic 1 (high) to logic 0 (low) at the input of any stage of the tapered buffer turns off the N transistor and turns on the P transistor of that stage, producing a transition from low to high at the output terminal of the respective stage. Similarly, a transition from low to high at the input of any stage of the tapered buffer turns on the N transistor and turns off the P transistor of that stage, producing a transition from high to low at the output terminal of the respective stage.

As shown in FIG. 1, the output of the first stage O1 drives the capacitive load that consists of the gate capacitances of the transistors P2 and N2 of the second stage, the output of the second stage O2 drives the capacitive load that consists in the gate capacitances of the transistors P3 and N3 of the third stage, and the output of the third stage Out drives the load capacitance $C_L$. The other parasitic capacitances, such as the junction capacitances, are ignored for this discussion, since for a typical tapered buffer sizing they are much smaller than the gate capacitances.

Each stage of this amplifier chain introduces a delay in the data signal propagation from the tapered buffer input to the tapered buffer output. A first order equation for the delay introduced by any stage of the tapered buffer is $$t = \frac{CV}{I} \quad (1)$$

s where t is the delay introduced by the stage, C is the capacitive load driven by the respective stage, V is the output voltage transition, and I is the current that charges (or discharges) the capacitive load C. The delay increases as the capacitive load C increases and decreases as the current I increases. For a logic family (for example a 5 V logic family), V is fixed. The current I increases as the transistor size increases, according to MOS transistor equations. However, the gate capacitance increases as the transistor size increases, also in a linear fashion. In order to obtain the same delay for the low to high (charging the load capacitor C) and high to low (discharging the load capacitor C) transitions of the output, the P and N transistors respectively of each stage must provide the same charging (or discharging) current I or the P and N transistors must have the same transconductance. Conventionally, to obtain the same transconductance for the N and P transistors of each stage of the tapered buffer involves sizing the P transistor three times the size of the N transistor of the respective stage.

The total delay introduced in the data path by a tapered buffer depends on the capacitive load $C_L$ that needs to be driven by the tapered buffer. Increasing the size of a stage of the tapered buffer decreases the delay introduced by that stage, but increases the gate capacitance of the constituent P and N transistors, and accordingly the capacitive load the stage represents for the previous stage, slowing down the previous stage. Also, since each stage of the tapered buffer introduces a delay, the total delay of the tapered buffer depends on the number of stages of the tapered buffer. For a given capacitive load $C_L$ that needs to be driven by a tapered buffer, an optimum exists so that the tapered buffer has minimum number of stages and introduces minimum delay. This optimum also provides the optimal sizing of each stage of the tapered buffer. According to this optimum, each stage of the tapered buffer is typically progressively increased in size by an optimal coefficient, each stage progressively providing higher amplification for the data signal (and higher charge/discharge current). The optimal coefficient is demonstrated to be e=2.713. For simplification of the following discussions, this optimal coefficient is considered equal to 3. Conventionally, the optimal coefficient is between 2.5 and 4.

According to the above, depending on the technology, the optimal transistor sizing and the internal capacitances at the internal nodes of the tapered buffer of FIG. 1 is: N1=1u, P1=3u, N2=3u, P2=9u, N3=9u, P3=27u, $C_{in}$=c, $C_{o1}$=3c, and $C_{o2}$=9c, where u and c are relative units for size and capacitance. For an optimal design, the delay introduced by any stage is equal to the delay introduced by any other stage. For the tapered buffer in FIG. 1, this would mean that the delay of stage 1 is equal to the delay of stage 2, and is equal to the delay of stage 3. Accordingly, the total delay of an optimal tapered buffer is 3 (or n) times the delay of any stage.

For each stage of an optimal tapered buffer besides the last stage, for a low to high input transition of that stage, the output of that stage has to drive the gate capacitance of the N transistor of the next stage which is parasitic. The capacitance of the N transistor for this transition represents 25% of the total capacitance present at the output of a stage. For a high to low input transition of that stage, the output of that stage has to drive the gate capacitance of the P transistor of the next stage which is parasitic. The capacitance of the P transistor for this transition represents 75% of the total capacitance present at the output of a stage. According to Equation 1, the delay introduced by any stage of an optimal tapered buffer is 25% larger for a low to high input transition of that stage, and is 75% larger for a high to low input transition of that stage.

In addition, the parasitic capacitances of the N and P transistors of each stage of an optimal tapered buffer under the conditions described above have major influence on the dissipated power of the tapered buffer. Since the transconductances of the N and P transistors of any stage are often designed to be equal, during the transition of the input signal of each stage, when both N and P transistors are on, short-circuit current surges from $V_{dd}$ to ground (GND) through the two transistors, producing a parasitic short-circuit power. Also, the dynamic power dissipated by any one stage, is $$P = CV^2 f \qquad (2)$$

where C is the capacitance at the output node of the respective stage, V is the operating voltage of the circuit, and f is the switching frequency of the respective node, which increases as the capacitance C at that node increases. Accordingly, due to the parasitic N and P transistors under the conditions described above, any stage dissipates 25% more dynamic power for the low to high input transition of that stage, and 75% more dynamic power for the high to low input transition of that stage. Thus, it would be desirable to provide a buffer circuit which does not have the performance disadvantages in terms of delay, power dissipation, and parasitic short-circuit power loss of the tapered buffer circuit.

U.S. Pat. No. 5,061,864 describes the digital buffer circuits shown in FIGS. 2 and 3, and the mono-phase logic concept. In both FIGS. 2 and 3, the upper path drives the P4 transistor for a low to high input transition of the buffer producing a low to high output transition of the buffer, and the lower path drives the N4 transistor for a high to low input transition of the buffer, producing a high to low output transition of the buffer. In FIG. 2, the following is provided: a relatively higher speed output pull-up turn on signal propagation path consisting of transistors N1U, P2U, N3U, and P4, called herein UO, a relatively higher speed output pull-down turn on signal propagation path consisting of transistors P1D, N2D, P3D, and N4, called herein DO, a relatively slower speed output pull-down turn off signal propagation path to turn off the final pull-down transistor N4 consisting of transistors N1D, P2D, and N3D, called herein DOF, and a relatively slower speed output pull-up turn off signal propagation path to turn off the final pull-up transistor P4 consisting of transistors P1U, N2U, and P3U, called herein UOF. To avoid or reduce the crowbar current between transistors N4 and P4, a negative feedback circuit arrangement is provided in the buffer of FIG. 3 consisting of GNA and GNO logic gates that replaces inverter I1U and I1D of FIG. 2, and a data saver circuit consisting of inverters IF5 and IF6 for saving the output data signal after turn off of both transistors N4 and P4.

Consider D, the delay of the buffer of FIG. 3 when the input signal has a waveform as illustrated in FIG. 4. Between any two input transitions there are kD time units, where k is greater or equal to 1. Consider a low to high input transition of the buffer, the signal propagates through UO and produces a low to high output transition after a delay D. The output, in the final high state, through inverter IF5 in the feedback path, turns off UO and turns on UOF. After kD time units, a high to low input transition of the buffer propagates through DO and produces a high to low output transition after a delay D. Transistor P4 must be off at the time the high to low input transition of the buffer turns on transistor N4 through DO. In other words, since UOF turns off transistor P4, UOF must turn off transistor P4 in approximately kD time units. A similar discussion can be made for DO and DOF.

The signal propagates through the relatively higher speed path (UO or DO) in D time units, while it is required to propagate through the relatively lower speed path (UOF or DOF) in approximately kD time units. Since for an optimal design each stage introduces the same delay, each of the four stages of the buffer shown in FIG. 3 introduces a delay equal to D/4 time units for the signal propagation. On the other hand, since transistors P4 and N4 are required to be turned off in kD time units, the time allocated for this procedure to each of the three transistors involved are approximately kD/3 time units. Considering inverter I2U in FIG. 3, if transistor P2U is of size S, the size of transistor N2U for a stage in a tapered buffer of FIG. 1 would be S/3. However, since for the buffer in FIG. 3, transistors P2U and N2U are required to provide different transconductances according to Equation 1, if transistor P2U is of size S, transistor N2U must be $$N2U = \frac{S}{4k} \qquad (3)$$

Similarly for inverter I3U of FIG. 3, if transistor N3U is of size S1, the size of transistor P3U for a stage in a tapered buffer of FIG. 1 would be 3S1. However, since for the buffer in FIG. 3, transistors N3U and P3U are required to provide different transconductances, then according to Equation 1, if transistor N3U is of size S1, transistor P3U must be $$P3U = \frac{9S1}{4k} \qquad (4)$$

In Equations 3 and 4, for large k (small frequencies), transistors N2U and P3U are much smaller than the corresponding sizes for a tapered buffer of FIG. 1, and similarly for all other similar transistors. Gate GNA, and inverters I2U and I3U represent a tapered buffer as in FIG. 1, specially sized according to the requirements of the buffer from FIG. 3. For this specially sized tapered buffer, and for small frequencies, transistors N2U and P3U discussed herein represent a minimal, negligible overhead for delay and power as described for the tapered buffer of FIG. 1. Accordingly, the output of each stage of this specially sized tapered buffer drives for small frequencies minimal (negligible) parasitic capacitances as discussed for the tapered buffer of FIG. 1. However, as the operation frequency increases, namely for small k values, transistors N2U and P3U sizes increase according to Equations 3 and 4. For large frequencies (k=1), transistors N2U and P3U sizes reach the sizes of the corresponding transistors in a tapered buffer according to FIG. 1. Accordingly, as the operation frequency increases, the chain of inverters from FIGS. 2 and 3 become similar to the chain of inverters in a tapered buffer of FIG. 1, presenting high parasitic capacitances discussed earlier, and thus experiences the performance degradation in delay and power dissipation similar to the tapered buffer. This means that the delay and power dissipation advantages of the buffer shown in FIGS. 2 and 3, which may be present at small frequencies, are absent at higher frequencies. The low or high frequency ranges of the buffer circuit depend on the particular technology used in the circuit, for example, for 1.2 micron-based semiconductors, high frequency may be 300 or 600 MHz and low frequency input signals may be 100 MHz or less. Thus, it would further be desirable to provide a buffer circuit capable of optimally transmitting data signals at higher speed and less dissipated power over any frequency of input data signals received by the buffer.

SUMMARY OF THE INVENTION

Accordingly, it is a principal object of the present invention to provide a buffer circuit for transmitting digital data signals from an input to output of the buffer for any frequency of input data signals with higher speed and less dissipated power than prior art buffer circuits.

It is another object of the present invention to provide a buffer circuit having one or more nulling transistors coupled with driving transistors which are operated to eliminate parasitic capacitance of the buffer circuit.

It is another object of the present invention to provide a buffer circuit needing fewer stages than prior art buffers for driving the same capacitive load.

It is still another object of the present invention to provide a buffer circuit for restoring slow transitioning signals with minimal delay and power dissipation.

It is a further object of the present invention to provide a buffer circuit capable of driving a highly resistive interconnect data line having capacitance, commonly referred to as an RC line, which can be inserted at multiple locations along such a line.

Briefly described, a buffer circuit embodying the present invention includes multiple stages having driving transistors in the direction of input to output of the circuit which define two data paths representing a fast "1" data path for transmitting a "1" state and a fast "0" data path for transmitting a "0" state. The first data path transmits a low to high transition, while the second data path transmits a high to low transition of an input data signal from the input to the output of the buffer. Each stage, except for the last stage, in each of the data paths has at least one nulling transistor coupled to the driving transistor of the stage which when enabled turns off the driving transistor of the next stage in the data path. An input NAND gate drives the first stage of the fast "1" data path and has at least two inputs. One of the inputs of the NAND gate is connected to the input of the buffer and the other of the inputs of the NAND gate is connected to the output of the buffer. An input NOR gate drives the first stage of the fast "0" data path and has at least two inputs. One of the inputs of the NOR gate is connected to the input of the buffer circuit and the other of said inputs of the NOR gate is connected to the output of the buffer circuit. A feedback path couples the output of the buffer to a series of inverters, in which each inverter has its input connected to the output of the next inverter and to the gate of the nulling transistor of each successive stage in both of the data paths. The inverter may alternatively be coupled in parallel with the output of the buffer. The nulling transistors are synchronously driven by the inverters in the feedback path to turn off (null) the driving transistors in each data path after the first stage, preparing the driving transistors in the data path for the next fast transition in the input signal. Each inverter provides a delay equal to the time to null one stage. These nulling transistors are separate from the data path and are referred to in the description as fast nulling transistors. The driving transistor of the first stage in each data path is turned off (nulled) by the logic gate of the data path as the input to the logic gate connected to the output of the circuit changes in state to that of the input of the circuit.

Except for the last stage of each data path, a second nulling transistor may be coupled to the driving transistor of each stage of the data path. This second nulling transistor is referred to as a maintenance nulling transistor. For each data path, a series of inverters is provided from the output of their respective input logic gate, in which each inverter's input is connected to the output of the next inverter and the gate of the maintenance nulling transistor of each successive stage in that data path. Each inverter provides a delay equal to the time to null one stage. When either the fast "1" or "0" data path is not active, i.e., not transmitting an input signal of its associated state, the maintenance nulling transistors in the data path prevent the data path from floating and possibly effecting the output of the buffer. The two data paths are connected after their last stage at the output of the buffer. A latch may be provided at the output of the buffer to maintain the output level until the next transition in the input data signal is received. The above described buffer circuit is referred to in the following description as a HD buffer.

In another embodiment of the buffer circuit, the input NAND gate represents the first stage of the fast "1" data path and the input NOR gate represents the first stage of fast "0" data path. Both the NAND and NOR gates each have two driving transistors and two nulling transistors coupled to the driving transistors. The NAND and NOR gates are sized to provide a voltage transfer characteristic having a low input threshold for detecting transitions in input data signals along their respective data paths, such that slow transitioning signals can be detected early on in each data path. For example, a 1 V threshold for detecting a low to high transition and a 4V threshold for detecting a high to low transition. The feedback path of the buffer circuit of this embodiment includes a chain of inverters coupled to the fast nulling transistors present at each stage, and if present, the maintenance nulling transistors of stages, between the first and last stage in each data path. The buffer of this embodiment is referred to in the following description as the HDR buffer. The HDR buffer and the HD buffer may have two states or three states (tri-stated).

In a further embodiment of the buffer circuit, again the input NAND gate represents the first stage of the fast "1" data path and the input NOR gate represents the first stage of fast "0" data path. Both the NAND and NOR gates each have two driving transistors, one for each input to the gate, and two nulling transistors coupled to the driving transistors. The feedback path is removed, and the output and input of the buffer are coupled to each other and to a highly resistive RC line, such as an interconnect data line of a chip having both resistance and capacitance. A series of delay elements, such as inverters, are coupled between the input the buffer, which is received at one of the inputs of each of the NAND and NOR gates, and the other input of the NAND and NOR gates and their nulling transistors. The delay elements enable the output of the buffer to automatically tristate after a transition propagates through the fast 1 or fast 0 data paths. The buffer circuit may provide a repeater for RC line, and multiple ones of the buffer circuit may be located as different locations along the line to provide multiple repeaters. This buffer is referred to in the following description as a TR buffer.

The input voltage received at each NAND and NOR gate of the HDR and TR buffers may optionally be provided through an inverter in their respective data path in which the input of the inverter is connected to the input of the buffer and the output of the inverter is provided to one of the nulling transistor and one of the driving transistors of the first stage in each respective data path. Such inverters can reduce line loading of the first stage of each data path.

The method embodied in the buffer circuits includes turning on all the driving transistors in one of the two data paths to propagate a transition in a signal received at the input of the buffer to the output of the buffer, while the other data path's driving transistors are off, and then after the input signal propagates to the output, nulling (turning off) each of the driving transistors in the data path propagating the signal before the next transition in the input data signal is received. The driving transistors may be synchronously nulled by successively turning on nulling transistors coupled to the driving transistors in data path propagating the transition in the buffer. All the driving transistors of the buffer circuit are thus off before each transition in the data signal at the input. The method may further include preventing the output of the driving transistors in the data path not propagating the transition in the buffer from floating by synchronously turning on other nulling transistors coupled to the driving transistors of the data path not propagating the transition in the buffer.

The optimal performance of the HD, HDR, and TR buffer circuits in terms of speed, area and power dissipation are enabled by the elimination of parasitic capacitances at the output of each of their stages through the use of nulling transistors in the circuits.

BRIEF DESCRIPTION OF THE DRAWING

The foregoing and other advantages of the present invention will become more apparent from the following detailed description when read in connection with the accompanying drawings wherein.

DETAILED DESCRIPTION OF THE INVENTION

Figure 5:
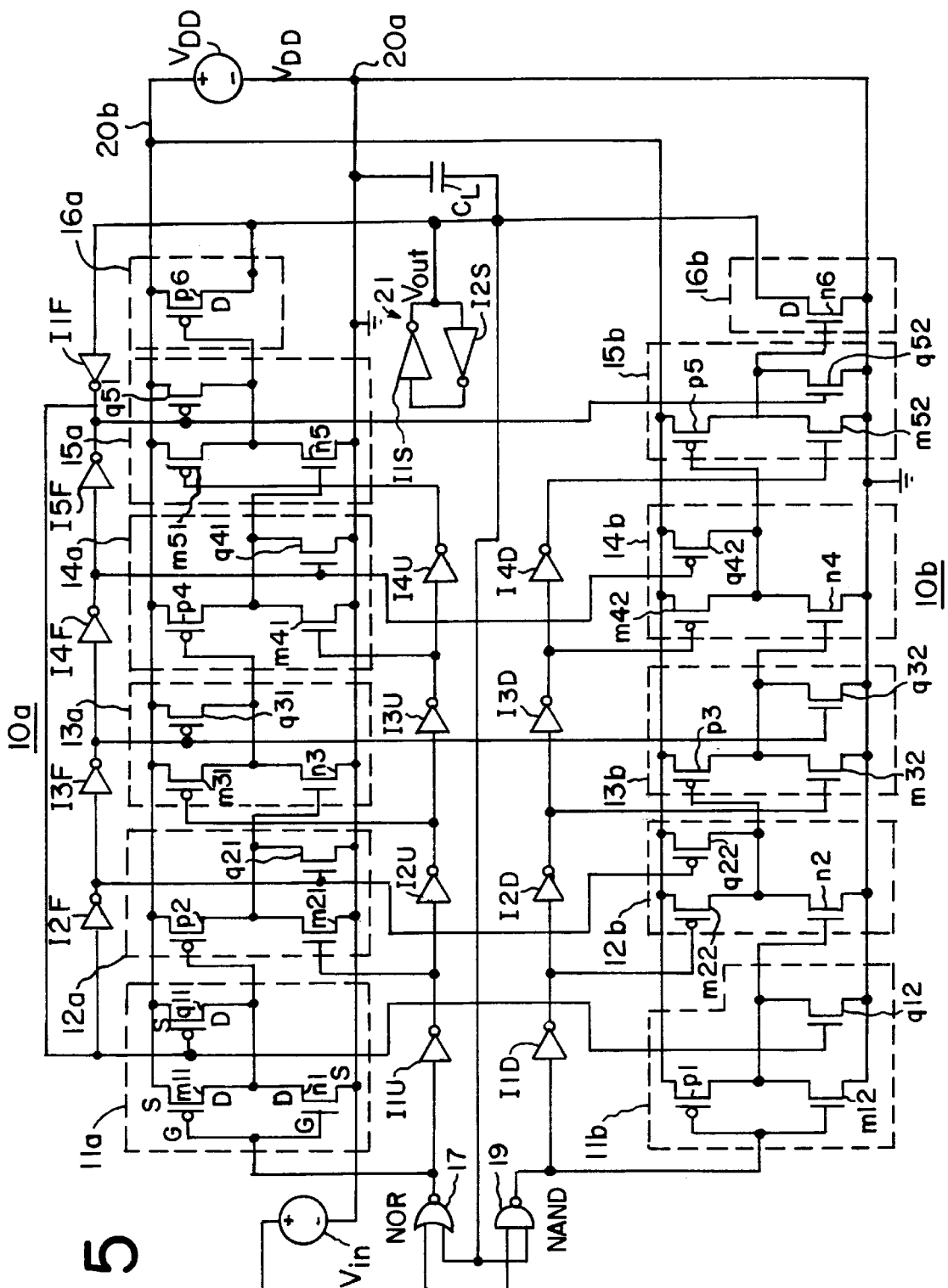
FIG. 5 is a schematic diagram example of the High-Drive (HD) buffer circuit in accordance with the present invention having an even number of stages in each of the data paths of the circuit.
Figure 6:
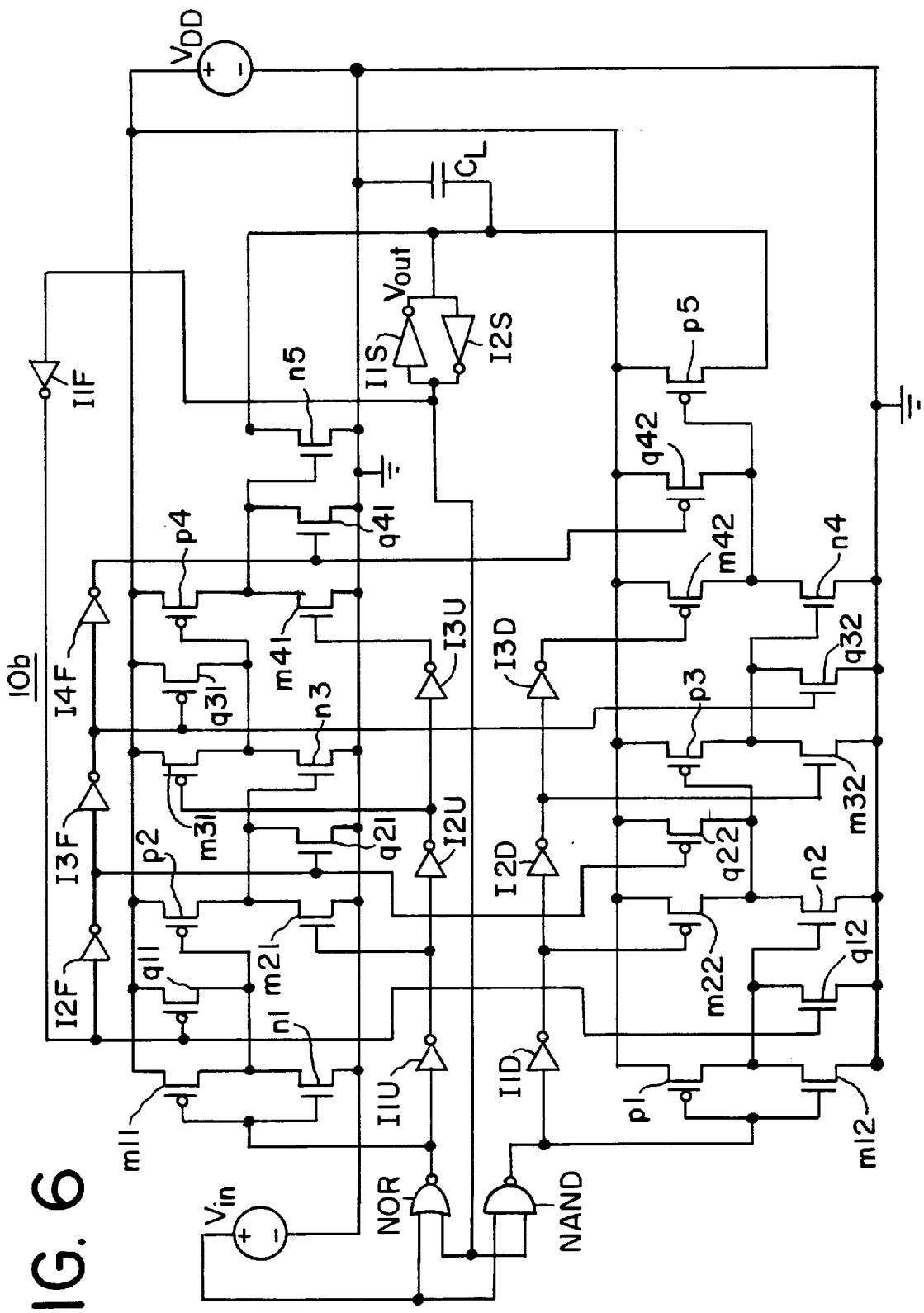
FIG. 6 is a schematic diagram example of the HD buffer circuit in accordance with the present invention having an odd number of stages in each of the data paths of the circuit.

Referring to FIGS. 5 and 6, a transistor level schematic is shown of a High-Drive (HD) buffer circuit 10a and 10b, respectively, having two categories of transistors: driving transistors (n and p) that source or sink each stage up to the load, and nulling transistors (m and q), which reestablish the logic levels. The HD buffer further includes input gates (NAND and NOR) and inverters (I). Such input gates and inverters are often called glue logic transistors. Buffer circuit 10a of FIG. 5 has six amplifying stages to illustrate a HD buffer having an even number of stages, while buffer circuit 10b of FIG. 6 has five amplifying stages to illustrate a HD buffer having an odd number of stages. The HD buffer may also have other number of stages. The driving transistors are denoted as n1–n6 and p1–p6 in which each successive stage's driving transistor is increasingly larger in size. To obtain the speed, power and area savings, the HD buffer uses two separate data paths, one for each logic state of the input signal (0 or 1). Each of the two paths is optimized to amplify and transmit one of the 1 or 0 input logic states and accordingly optimally responds with minimum delay and power dissipation to the low to high or to the high to low input transitions, respectively, at an input Vin to on output Vout of the buffer, where for example low represents approximately 0 V and high represents approximately 5 V. The path that optimally amplifies and transmits the 1 input logic state is called herein the fast 1 path, and the path that optimally amplifies and transmits the 0 input logic state is called herein the fast 0 path. Referring to the HD buffer 10a in FIG. 5, the six stages of the fast 1 path are: stage one 11a includes transistors n1, m11, and q11, stage two 12a includes transistors p2, m21, and q21, stage three 13a includes transistors n3, m31, and q31, stage four 14a includes transistors p4, m41, and q41, stage five 15a includes transistors n5, m51, and q51, and stage six 16a has p6. The six stages of the fast 0 path are: stage one 11b includes p1, m12, and q12, stage two 12b includes n2, m22, and q22, stage three 13b includes p3, m32, and q32 four 14b includes n4, m42, and q42, stage five 15b includes p5, m52, and q52, and stage six 16b has transistor n6. These two data paths are combined after their final stages at output Vout to drive the output load, a capacitive load.

For any stage but the last stage, and for either of fast 1 or fast 0 path, the output of one stage connects the drains of the driving transistor and of the two nulling transistors of that stage and the gate of the driving transistor of the next stage. Accordingly, the load for any driving transistor of any stage of any path, but the last stage of each path, consists in the gate capacitance of the driving transistor of the next stage along the path and the drain capacitance of the nulling transistors of the stage.

In FIGS. 5 and 6, the CMOS digital buffer has a first power rail 20a and a second power rail 20b and an input node at Vin and an output node at Vout. Each of the fast 1 and fast 0 data paths have a series of successive stages from the input node to the output node. Each stage may represent an amplifier of a transitioning signal along their respective paths. An input NOR gate 17 for the fast 1 path, and NAND gate 19 for fast 0 path, couples the first stage of their respective data paths to Vin. Each input gate 17 and 19 has two inputs, one which receives the input signal Vin and other the output signal Vout. The input logic gates 17 and 19 place a condition on the input signal to the first stage of their respective data paths, respectively, such that the output of the logic gates propagate a transition in a signal at the input Vin to the output Vout through the driving transistors of the data path defined for that transition or state, such that Vin will be the same as Vout in state.

Each of the stages, other than the final stage 16a and 16b, in each of the data paths is as follows for the HD buffer. The source of the driving transistor is connected to one of the two power rails 20a or 20b. The gate of the driving transistor is connected to no other gate but to the output of its input logic gate of the data path or to the drain of the previous driving transistor. The drain of the driving transistor is connected to the drain of two nulling transistors (m and q) that have their sources connected to the other power rail than the corresponding driving transistor and their drains to the gate of the next driving transistor in a data path. The driving transistor of the stage is also connected in an inverter configuration with a nulling transistor (m) in the stage. The input of this inverter is connected to the output of the input logic gate 17 or 19 of the respective data path if the stage is the first stage in the data path, or otherwise, to the drain of the previous driving transistor. The output of this inverter is connected to the drain of a nulling transistor (q) that has the source connected to the other power rail than the driving transistor and to the gate of the next driving transistor.

The final stage of each data path has the drain of the driving transistor (p6 for the fast 1 path, or n6 for the fast 0 path) to the output Vout and the source of the driving transistor to one of the two power rails. Buffer control circuitry represented by the inverter (I) in combination of with the nulling transistors (m and q) operate to control the nulling process of each data path, as will be described later.

The optimal speed of the HD buffer is provided by the minimal capacitance each stage drives and from the following effect. In the prior art buffers of FIGS. 1 and 2, the N and P transistors of a stage have the gates connected together to the output of the previous stage and thus conduct simultaneously during an input transition of that stage, creating a DC path between $V_{DD}$ and GND. This current surge from $V_{DD}$ to GND adversely degrades the charge/discharge process of the load capacitance present at the output of that stage, increasing the delay. The effect increases as the transconductances of the N and P transistors tend to be equal, but is present for any transconductance ratio. For the HD buffer, this effect does not exist, since, when a driving transistor is turned on, the nulling transistor pair is off (the nulling process is completed). The smaller capacitance at the internal stages also provides savings in the dissipated dynamic power and higher tapering coefficients from stage to stage which implies fewer stages, necessary to drive a certain load. Fewer stages have again implications on increasing the speed of the HD buffer.

In order to generate a fast output transition from a change in state at the input of the buffer, only the driving transistors of the data path associated with that transition, 0 to 1 or 1 to 0, are on, the driving transistors of the other data path not propagating the transition are off. In other words, as a transition propagates through one of the two data paths, only one of the final or intermediate driving transistors of the data path pull up or down at any one time.

In FIG. 5, the fast 1 path is driven by the NOR gate 17 while the fast 0 path is driven by NAND gate 19. The inputs to these gates are the data input Vin and output Vout of the buffer. The fast 1 path is driven if both inputs of the NOR gate are in the 0 state. The fast 0 path is driven if both inputs of the NAND gate are in the 1 state. For a 1-0 or 0-1 input combination, neither path is driven. The feedback path from the buffer output to the input of the two logic gates drives the fast 1 and the fast 0 paths for a short period of time (from the change of state at the data input until the output reaches the final state).

The gates of the m and q nulling transistors do not affect the fast 1 and fast 0 data paths, and accordingly they do not affect the speed or the dynamic power dissipation of the data paths. As explained next, by being separated from the data path, the nulling transistors eliminate also any short circuit or DC power dissipation by synchronously driving the nulling transistors. In FIGS. 5 and 6, each stage has double nulling transistors m and q. The m transistors are called the maintenance nulling transistors (MNT) and the q transistors are called the fast nulling transistors (FNT). The nulling transistors of one stage turns off the driving transistors of the next stage.

In between transitions, when no path is driven, the output of the NOR gate 17 is 0, and the output of the NAND gate 19 is 1. Under this condition, the NOR gate 17 drives the MNT through a chain of serially connected inverters I1U, I2U, I3U, and I4U, and the NAND gate 19 drives a chain of serially connected inverters I1D, I2D, I3D, and I4D, in which the input of the first inverter in each chain is connected to their respecting logic gate 17 or 19, the output of each inverter is connected to the input to the next inverter and to the gate of an MNT, except for the last inverter in each chain which is only connected to the gate of an MNT. In the FIG. 5 example, for the fast 1 path, MNT m11 is coupled to output of NOR 17 and to the input of inverter I1U, and the output of inverter I1U is connected to the input of inverter I2U and the gate of MNT m21, and so on, until inverter I4U is connected to the gate of the last MNT m51 in the data path. Each inverter in each of the chains I1U–I4U and I1D–I4D of inverters introduce a delay greater or equal to the time necessary to null the driving transistors of the associated stages of the data path. For example, the delay introduced by inverter I1U and I1D provide a delay greater or equal to the delay to null the first stage of their respective data path, inverters I1U with I2U and inverters I1D with I2D provide a delay greater or equal to the delay to null the first and second stages of their respective data paths, and so on. A similar structure of inverters is provided for in FIG. 6.

As shown in FIGS. 5 and 6, the FNTs are driven by the output Vout of the buffer through the upper chain of serially connected inverters I1F, I2F, I3F, I4F, and I5F. The output of each inverter, but the last inverter in the chain, is connected to the input of the next inverter in the chain and to the gates of two q nulling transistors, one PMOS and the other NMOS, of the stages having corresponding positions in their respective data paths. In the FIG. 5 example, for stage one, the gates of PMOS transistor q11 and NMOS transistor q12 are coupled to the output of the buffer through inverter I1F, and for stage two, the gates of NMOS transistor q21 and PMOS transistor q22 are coupled to the output of the buffer through inverters I1F and I2F, and so on for successive stages in which the last inverter in the chain is connected to only the gates of two nulling transistors for stage five. For each stage, a certain number of inverters introduce a delay greater or equal to the time necessary to null the driving transistor with the same position in their respective data path. The driving transistor n1 and p1 of the first stage in each data path, respectively, is turned off (nulled) by the logic gate of the data path as the input to the logic gate connected to the output of the circuit changes in state to that of the input of the circuit.

The operation of MNT and FNT transistors is described below. For example, suppose the output of the HD buffer is in 1 state, implying that the fast 1 path was active. The next transition is from 1 to 0, so the next active path will be the fast 0 path, and then again the fast 1 path becomes active. The final driving transistors are connected on the same load. The fast 1 path which provides a 1 at the output is sourced by the p6 transistor. The 0 output is generated by the fast 0 path through the n6 transistor. At any time, for a fast output transition, only the p6 or n6 transistor should be on. Since, in this example, a fast 1 to 0 output transition is desired, only the n6 transistor must be on at the time of transition. The p6 transistor must be turned off before n6 is turned on. The p6 transistor is therefore turned off (nulled) in between transitions when no path is driven by slowly charging the gate of the p6 transistor through the corresponding nulling transistors. To efficiently turn off the p6 transistor, n5, p4 n3, and p2 transistors are turned off by the corresponding nulling transistors of each prior stage. The n1 transistor is turned off by the NOR logic gate 17 as the input to the logic gate which is connected to the output of the circuit changes in state to that of the input of the buffer. The nulling transistors slowly turn off the driving transistors by charging or discharging the gates of the driving P or N type transistors. This process prepares the driving transistor for the impending fast transition. This nulling process is realized by the FNT transistors driven by the output. The NAND and NOR input gates are sized to be equivalent to a minimal inverter. For a high frequency of transitions, the FNT sizes could be up to providing the same transconductance as the driving transistors (k=1 in FIG. 4). If the FNT would be driven by the input gates (as in FIG. 7), and the frequency of transitions is high, then the fast 1 and fast 0 data paths could be increasingly loaded, since inverters I1U–I4U and I1D–I4D are considerably sized to complete the nulling process between transitions. This would affect the speed and power dissipation of the HD buffer. This configuration, with the FNT transistors driven by the output, makes, among other advantages, the nulling process to operate as fast as needed without degrading the speed and power dissipation of the HD buffer.

When the fast 1 path is nulled, only the FNT transistors of the fast 1 path are driven by the chain of inverters I1F–I5F, while the FNT transistors of the 0 path are off. This means that during this time, which could be up to a half a period of the input signal, the internal nodes (at the gate of each driving transistor) of the 0 path in this case are floating if the MNT transistors were not present in the circuit. This floating state would make the internal nodes susceptible to noise, such as substrate coupling, capacitive coupling, cross-talk, and also to leakage. A glitch induced at any of these nodes could create a malfunction of the buffer for the next transition of the input signal, reflected in either an increase in delay, an increase in the dissipated power, or both. The malfunction can be catastrophic for the system that is driven by the input signal which could be a clock. For example, a transition could be propagated with a distorted, slow edge that could be recognized by some but not all of the driven registers, or could create race conditions through uncontrollable induced skew. To prevent such a floating state, the MNT transistors are driven by the input gates 17 and 19 in each data path. The MNT transistors are minimally sized, much smaller than the FNT transistors, since their only role is to compensate any leakage and noise susceptibility of the internal nodes for up to half a period of the input signal. Being minimally sized, the MNT transistors do not affect the data paths.

The driving and FNT transistor pair for each stage of both the fast 1 and fast 0 paths could have effect on the short circuit and DC power dissipation of the HD buffer. Due to the MNT size, the MNT transistor influence on the dissipated short circuit and DC power is negligible for all stages of both paths. To completely eliminate any short circuit and DC power dissipation for all stages of both the fast 1 and fast 0 paths, each group of nulling transistors are synchronously driven with the nulling process, so that no DC path is created between the driving and nulling transistor pair. As described earlier, each inverter in the nulling path, either inverters I1U–I4U, I1D–I4D, or I1F–I5F, introduces a delay equal to the time necessary to null one stage. Thus, when the nulling process of one stage is completed, the next stage starts to be nulled. For example, when the nulling process of stage one of fast 1 path is terminated and transistor p2 is off, stage two starts to be nulled by turning on transistor m21 through inverters I1U and transistor q21 through inverter I2F; transistor p2 being off, eliminating any DC path. This improvement substantially reduces the dissipated power of the HD buffer. An expression for the total dissipated power is $$P = (C_L + \Sigma C_i + \Sigma C_j) V^2_{DD} f \qquad (5)$$

where $C_i$ are the capacitances at the internal nodes in the 0 path and 1 path and $C_j$ are the node capacitances of the nulling transistors.

Figure 7:
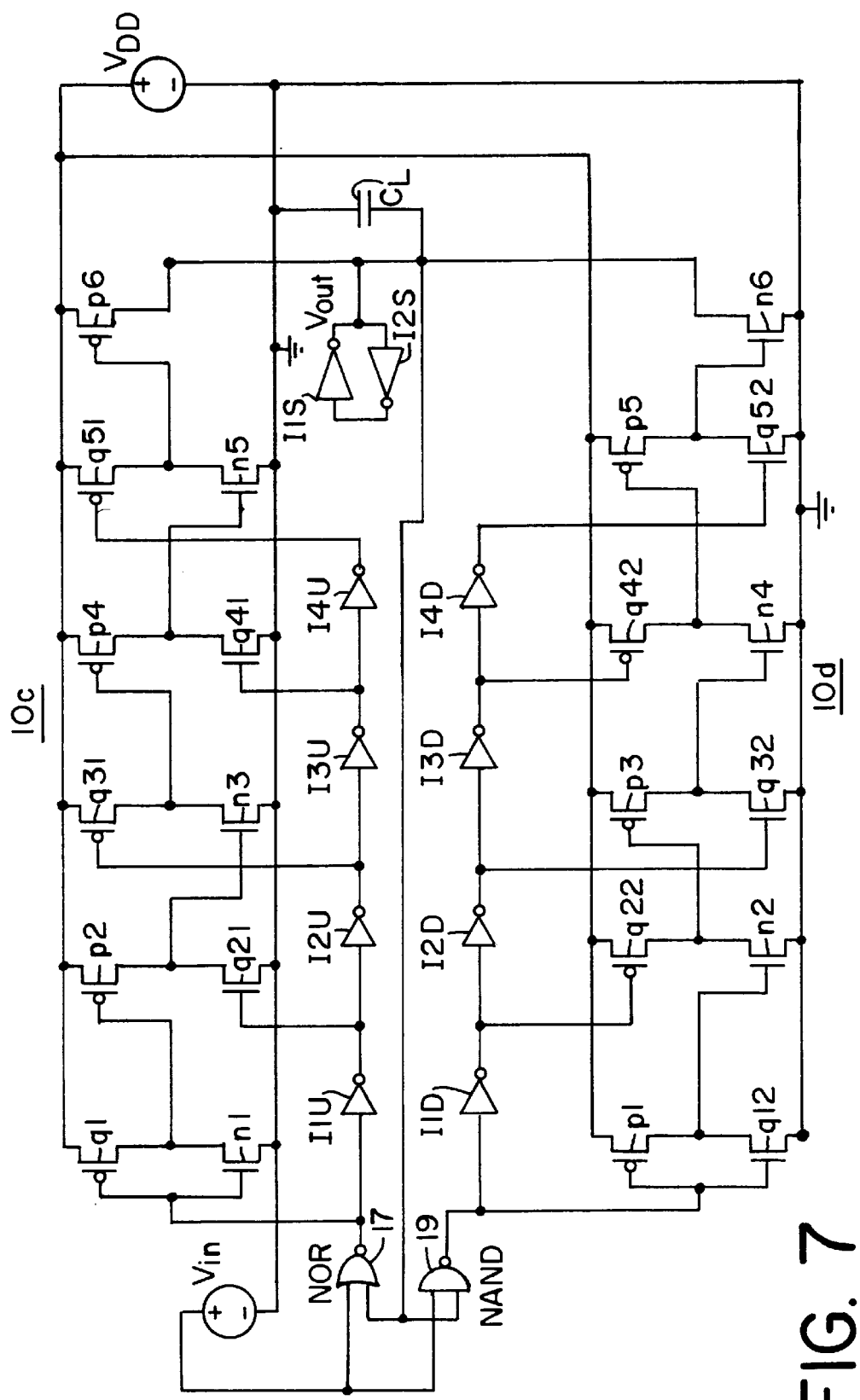
FIG. 7 is a schematic diagram example of another HD buffer circuit in accordance with the present invention having circuit stages with a single nulling transistor.

As shown in the HD buffer circuit 10c of FIG. 7, if the frequency of transitions of the input signal is low, the MNT transistor may be removed and only the FNT transistors are used for the nulling process. The FNT transistors can be driven by the input gates 17 and 19 by inverter chain I1U–I4U and inverter chain I1D–I4D, respectively, similar to the MNT transistors of FIGS. 5 and 6. In this case, the FNT transistors prevent the noise and leakage problems since they behave as MNT transistors as well. The data paths are not affected, since the FNT transistors do not reach a size that can become disturbing as explained earlier. The synchronous driving of the nulling transistors is similar to that described earlier, but with the chains of inverters driven by the input gates.

Figure 8:
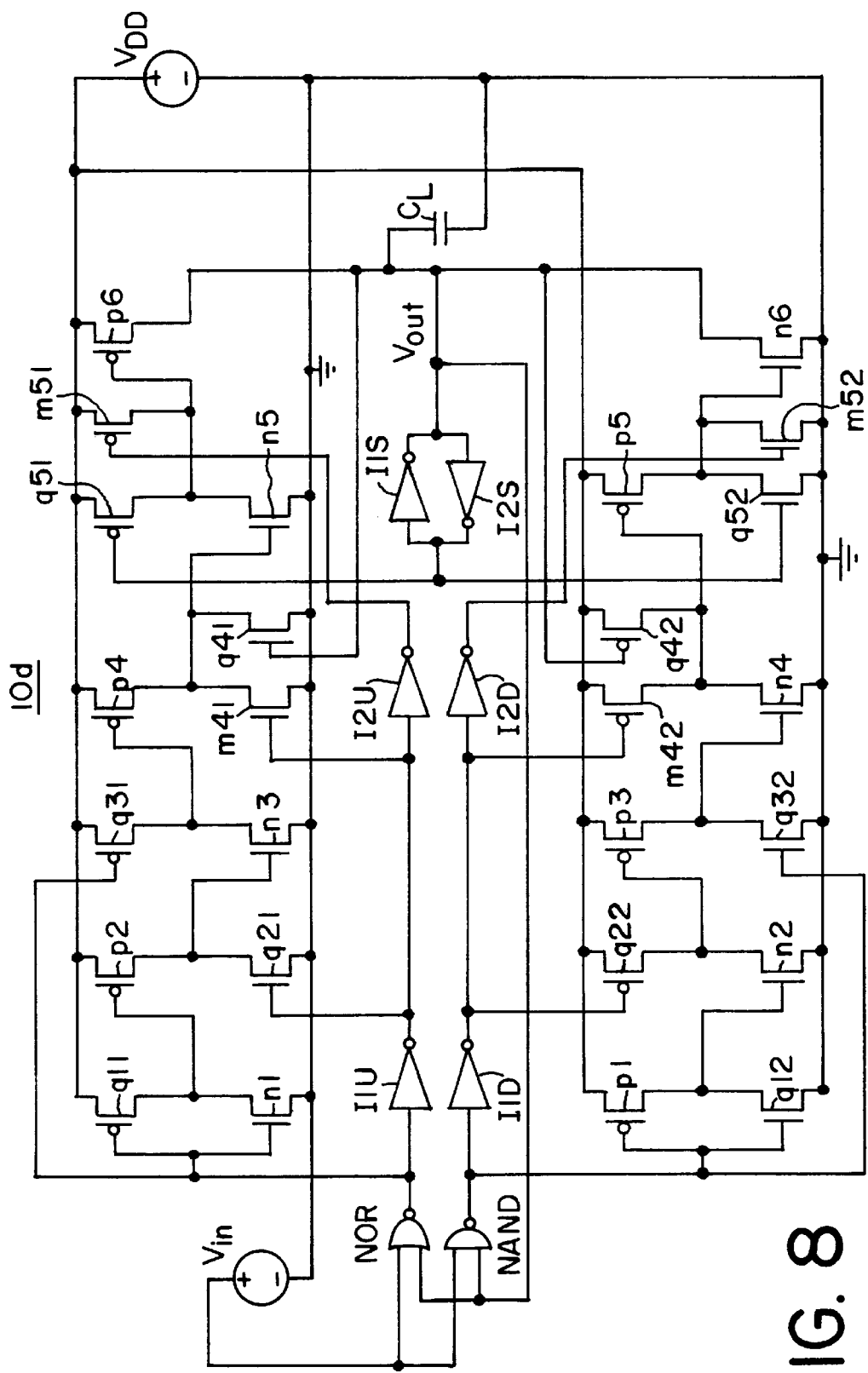
FIG. 8 is a schematic diagram example of a HD buffer circuit in accordance with the present invention having stages with single and double nulling transistors.

The HD buffer circuit 10d in FIG. 8 uses single nulling transistors for the less significant stages as in FIG. 7, and double nulling transistors as in FIG. 5 and FIG. 6 for the final stages that require larger nulling transistors. The advantage of buffer circuit 10d is a reduction in the hardware overhead represented by inverters I1U–I4U, I1D–I4D, and I1F–I5F, with implications on power reduction. The HD buffer example shown in FIG. 8 does not employ synchronous driving. However, for a reduction of the short circuit and DC power, the combined synchronous driving as in FIG. 5 and FIG. 7 may be provided for in the HD buffer of FIG. 8.

Figure 4:
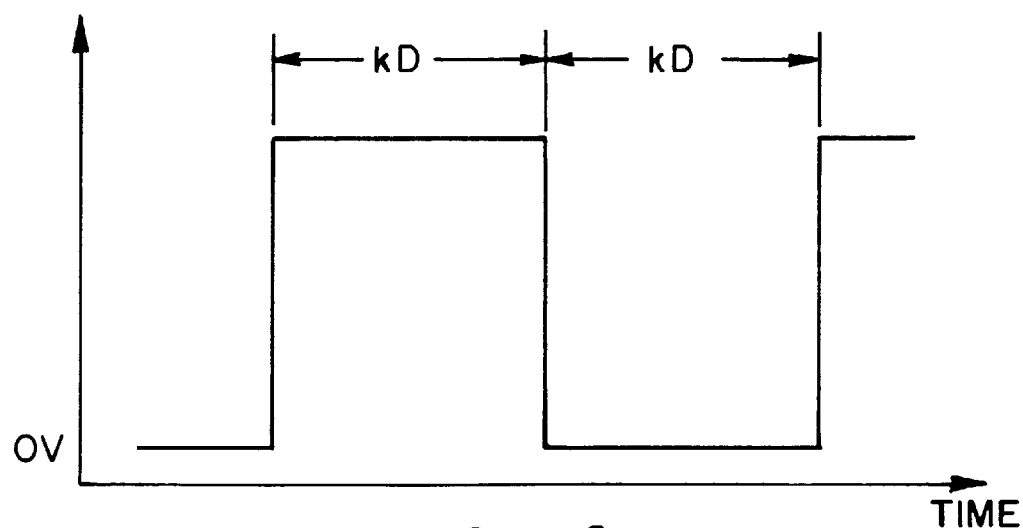
FIG. 4 is the signal waveform of a digital input signal.
Figure 9:
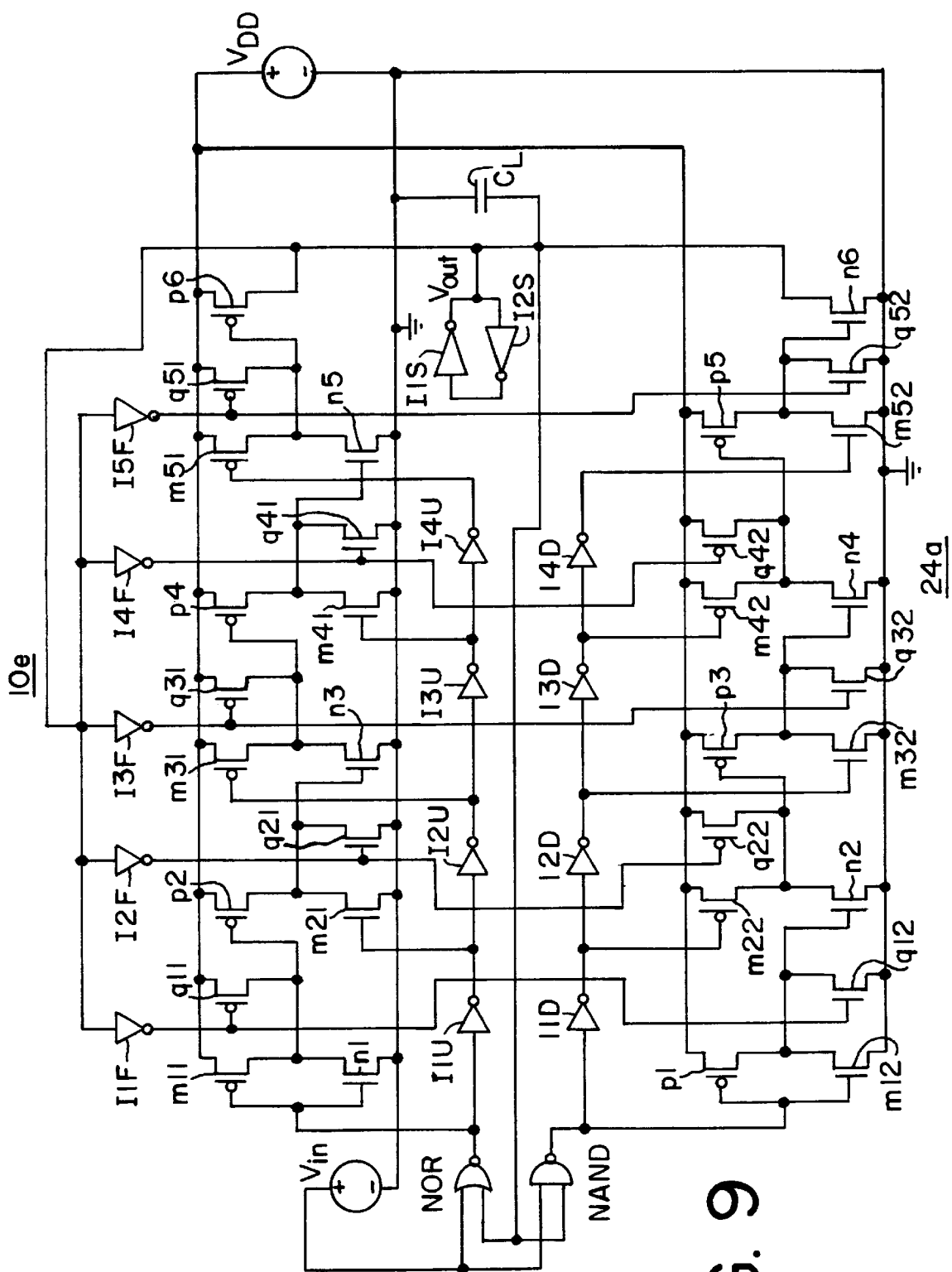
FIG. 9 is a schematic diagram example of a HD buffer circuit similar to FIG. 5 utilizing wave synchronous nulling of nulling transistors to null driving transistors of the stages of the circuit.

For very high frequencies of the input signal (very small k according to FIG. 4) the delay of the fast 1 and fast 0 path is not affected, however, the power dissipation of the HD buffer of FIGS. 5 and 6 could increase due to the nulling process. The FNT transistors could reach the same transconductance as the corresponding driving transistors for all stages. Accordingly, the FNT transistor sizes are large. In FIG. 5, inverter I1F drives the gate capacitances of transistors q11 and q12 and the gate capacitance of inverters I2F, I2F drives the gate capacitance of transistors q21 and q22 and the gate capacitance of inverter I3F, and so on, inverter I5F drives the gate capacitance of transistors q51 and q52. Each of the inverters I1F–I4F has to drive a parasitic capacitance represented by inverters I2F–I5F respectively. While the inverter chain of inverters I1F–I5F shown in FIG. 5 is reliable for synchronous driving since each inverter is designed to introduce the same delay D1 as required by the nulling process, for high frequencies, due to the effect mention above, this inverter chain configuration could dissipate significant parasitic power. To eliminate this parasitic dissipated power, inverter I1F–I5F may be provided in a wave inverter configuration as shown in FIG. 9, rather than a serially configuration, where the inverters I1F–I5F are in parallel to each other and each are in a feedback path coupled to the output Vout of the buffer to drive two FNT transistors in the two stages having corresponding positions in each of the data paths. For example, the input of inverter I1F is connected the output of the buffer and the output of this inverter is connected to the gate of PMOS transistor q11 and NMOS transistor q12, and the input of inverter I2F is connected the output of the buffer and the output of this inverter is connected to the gate of NMOS transistor q21 and PMOS transistor q22, and so forth. Now each of the inverters I1F–I5F drives only the gate capacitances of the corresponding q transistors. However, to provide synchronous driving, inverter I1F introduces a delay D1, inverter I2F introduces 2D 1, inverter I3F introduces 3D1, inverter I4F introduces 4D1, and inverter I5F introduces 5D1=KD, as shown in FIG. 4.

The HD buffer in FIG. 7 and FIG. 8 (without synchronous driving) can be used for low frequency input signals, the HD buffer in FIG. 8 with synchronous driving can be used for medium frequency input signals, and the HD buffer in FIGS. 5, 6 and 9 for medium and high frequency input signals. The number of stages of the buffer is optimally chosen for minimum delay following a methodology similar to the one used for the tapered buffer of FIG. 1, and depends on the capacitive load of the buffer, $C_L$.

In between transitions, once the nulling logic state is reached, no path is driven, and the nulling process for the current path is completed, $C_L$ floats and any leakage current could destroy the state. This effect is prevented by the small latch 21 (as shown for example in FIG. 5) at the output of the buffer, which maintains the output state on $C_L$. The output latch is sized knowing the time for which $C_L$ is floating (equal to T/2-(total nulling time for all stages)), and the leakage characteristics of the load. The latch is also sized so that the leakage is compensated for the time that $C_L$ floats. The latch is sized smaller than the driving transistors, which, during transitions, will source or sink more current than the latch, there by determining the output state. The latch is sized small since it has to supply only the leakage current on the output load. The above floating effect of $C_L$ can also be compensated for by noting that the nulling time is inversely proportional to the width of the nulling transistor. Making the nulling transistors small, delays the nulling process and $C_L$ floats for a shorter amount of time. At the limit, the nulling time equals the time between transitions and $C_L$ does not float at all and no latch is needed. However, a fast transition is achieved when only one final transistor pulls at one time. If the nulling process is not completed by the time the next transition occurs, the transition will be degraded. Therefore, the nulling transistors must be sized so that the nulling process is completed before but close to the moment when the next transition occurs.

Based on the process of charging/discharging a capacitive load by a PMOS/NMOS transistor, the sizing considerations for an optimal HD buffer are presented next. The capacitive load at each node of the buffer circuit should be correctly derived, considering the gate and junction capacitances of the transistors present at that node.

The NAND and NOR input gates are sized to be equivalent with a minimal inverter. Accordingly, they will represent a minimal load for the line or circuit that drives the buffer.

Figure 1:
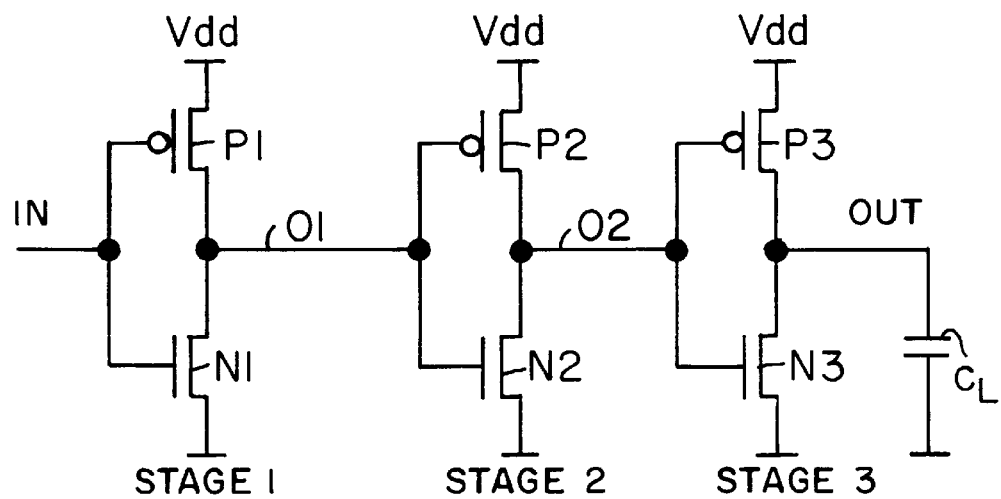
FIG. 1 is a schematic diagram of a tapered buffer according to prior art.
Figure 2:
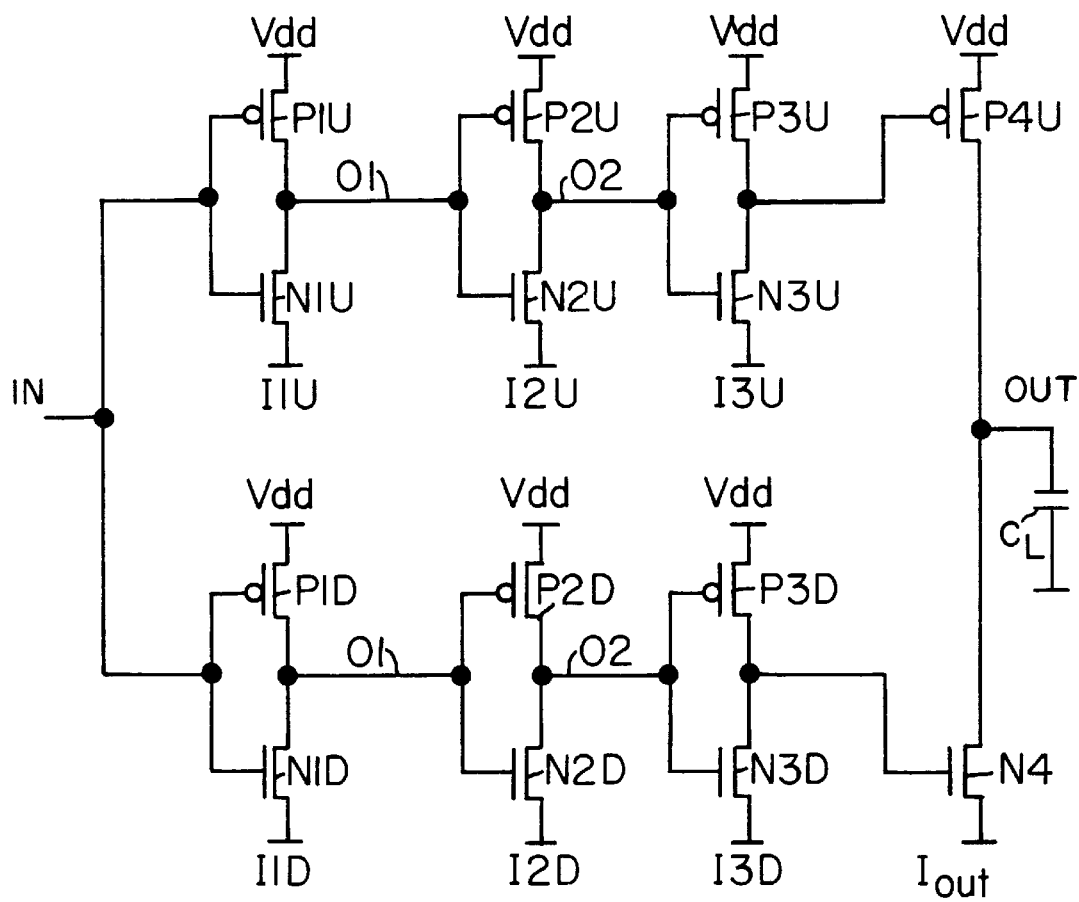
FIG. 2 is a schematic diagram of a digital buffer according to prior art.

The HD buffer driving transistors are sized from the condition that each stage introduces the same delay, equal to the delay introduced by the final stage. The load, $C_L$, is known, and the size of the driving transistor of the first stage of the fast 1 path (n1) is chosen. The optimal (minimal) delay is found, as a function of the number of stages of the HD buffer and of the first stage size. The size of the n1 transistor is either chosen minimal for the considered technology, or is chosen to represent a standard load for the input gate as known from the prior art (equivalent to an e=2.713 tapering coefficient for optimal speed or equivalent to an e≈10 for optimal power). Since an n driving transistor of any stage drives only the gate capacitance of the following p driving transistor, and a p driving transistor of any stage drives only the gate capacitance of the following n driving transistor, the optimal transistor sizing for optimal speed gives approximately that if the size of the n transistor is S2, the size of the p transistor should be 12S2, and if the size of the p transistor is S3, the size of the n transistor should be 4S3. An e=3 was considered, and the junction capacitances, which are much smaller than the gate capacitances for this sizing, were neglected. By this sizing, the load of any driving transistor of a HD buffer as shown in FIG. 5 is equivalent to the load of a corresponding stage of a tapered buffer as shown in FIG. 1. Practically, the p transistor of each stage is between 6 and 12S2, and the n transistor of each stage is between 2 and 4S3. According to these sizing considerations, due to the absence of any parasitic capacitances, the driving transistor sizes significantly increases from stage to stage. For example, considering the buffer in FIG. 5 and the above-mentioned ratios as 12 and 4 with n1 transistor size as u, the following transistor sizing for the driving transistors is obtained: n1=u, p2=12u, n3=48u, p4=576u, n5=230u, and p6=9216u. Since the output must have similar high to low and low to high transitions, p6 and n6 must have the same transconductance. Accordingly, n6=3072u, p5=768u, n4=64u, p3=16u, n2=1.4u, and p1=0.35u. Comparatively, the sizing of a six stage optimal tapered buffer, similar to the three stage tapered buffer shown in FIG. 1 is: N1=u, P1=3u, N2=3u, P2=9u, N3=9u, P3=27u, N4=27u, P4=81u, N5=81u, P5=243u, N6=243u, P6=729. The driving strength of a six stage HD buffer can be achieved by approximately a nine stage tapered buffer, with higher delay and more power dissipation. Moreover, the HD buffer keeps the same performance in delay independent of the input signal frequency, as shown in FIG. 4.

A sizing alternative for the driving transistors is to consider a final stage of the same size as for an equivalent tapered buffer. The HD buffer driving transistors of all the other stages but the final stage, are sized from the condition that each stage introduces the same delay, which is not equal to the delay introduced by the final stage. The load that each final transistor represents for the prefinal transistors of each of the fast 1 path and fast 0 path can be determined since the final transistor sizes are known. The size of the driving transistor of the first stage (n1) is chosen as above. All the transistors of the fast 1 and fast 0 paths up to the final stage constitute a predriver. The optimal (minimal) delay of the predriver is found, as a function of the number of stages of the predriver and of the first stage size. The advantage of this alternative is a better speed-power-area trade off.

The fast nulling transistors are sized considering that if kD is the time between any two input signal transitions as shown in FIG. 4, then the nulling process must be performed in less than kD, so that the final driving transistors are not on at the same time. If the HD buffer has x stages, the time allocated to null each stage is approximately kD/x. Computing the capacitive load at each node to be nulled, each nulling transistor is sized to perform the nulling process during the kD/x allocated time. The maintenance nulling transistors are minimally sized, and depend only on the capacitance leakage current characteristic of the process and on the imposed noise immunity level.

The transistors in the chain of inverters are sized for synchronous driving as discussed above. While inverters I1U–I4U and I1D–I4D are not critical since the short-circuit and DC power dissipated due to the maintenance nulling transistors is negligible as discussed above, the accent is put on sizing the I1F–I5F inverters. Each of the inverters I1F–I5F in the chain must introduce the same delay as the nulling process for one stage, which is kD/x as shown above. Knowing the delay that must be introduced by each inverter in the chain (kD/x) and computing the capacitance at each node (consisting of the gate capacitances of an FNT and of the next inverter in the chain plus the junction capacitance present at that node), all inverters in the chain are sized. Sizing starts with the last stage. Typically, for a safe design, the delay introduced by any of the I1F–I5F inverters is designed larger than the time necessary for the nulling process of one stage. Accordingly, practically, the nulling process of all stages must be performed in less than kD.

The optimal HD buffer according to the above sizing has less stages than a tapered buffer for a similar load. The higher the load, the larger the difference in the number of stages between the two is, the better the speed and the power savings of the HD buffer.

The intrinsic power of any buffer circuit is composed of the dynamic power, short circuit power, and DC power. The intrinsic power does not include the power dissipated on the output load $C_L$, which is constant and cannot be modified. As mentioned, by synchronous driving the nulling transistors, the short circuit power and DC power are ideally eliminated for the HD buffer. A short circuit power remains present in the glue logic transistors. However, due to the insignificant size of these transistors as compared to the driving transistors, this short circuit power is negligible. Thus, the dynamic power is the only intrinsic dissipated power component of the HD buffer. The intrinsic dynamic power for any circuit is proportional to the total width of the transistors in the circuit schematic. Since the HD buffer eliminates any parasitic capacitances by having the nulling transistors separate from the driving data paths, the total width is smaller, and the dynamic power is smaller.

If for a certain application the dissipated power is more critical than speed, the HD buffer driving transistor sizes can be significantly decreased. The HD buffer ends up for example to provide the same speed as a tapered buffer (with normal transistor sizes, the HD buffer is much faster), with significant power and area savings. The dissipated power of the HD buffer is significantly decreased since the dynamic power is significantly decreased when reducing the total width, according to the above considerations. It should be mentioned that the total number of stages of the HD buffer is also further decreased by considering smaller sizes for the driving transistors, since the required delay as a function of the number of stages is no longer the minimum point on the delay-number of stages characteristic as above. The area is significantly decreased since the area is also proportional to the total width of the transistors. However, due to the smaller driving transistor sizes, the output signal low to high and high to low output transitions are slowed down compared to a normally sized HD buffer. The higher the savings in power and area, the smaller the driving transistors, the slower the output signal transitions.

Figure 10:
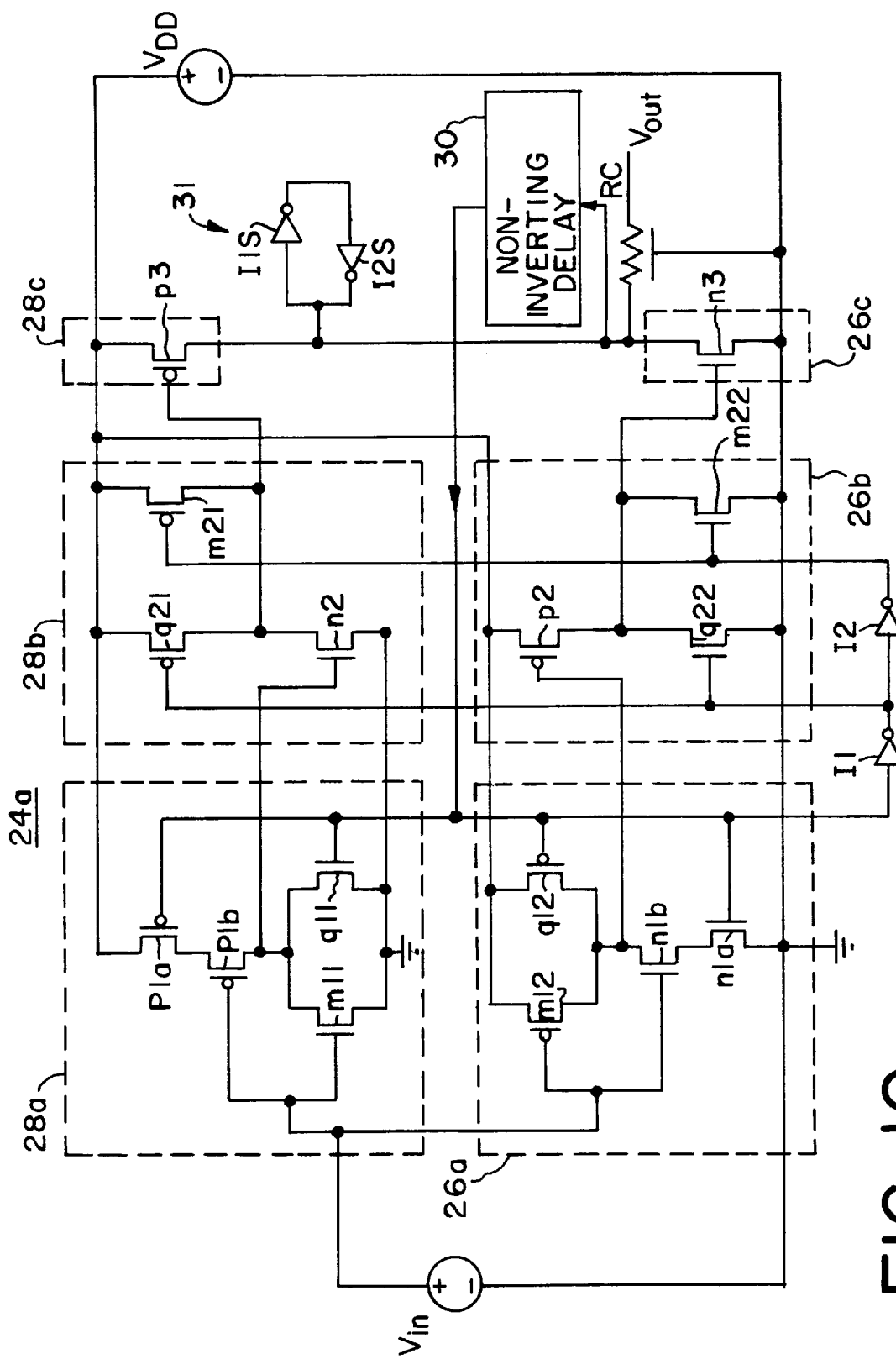
FIG. 10 is a schematic diagram of another buffer circuit in accordance with the present invention, referred to as an HDR buffer circuit, showing, for example, three stages in each of the data paths of the circuit.
Figure 11:
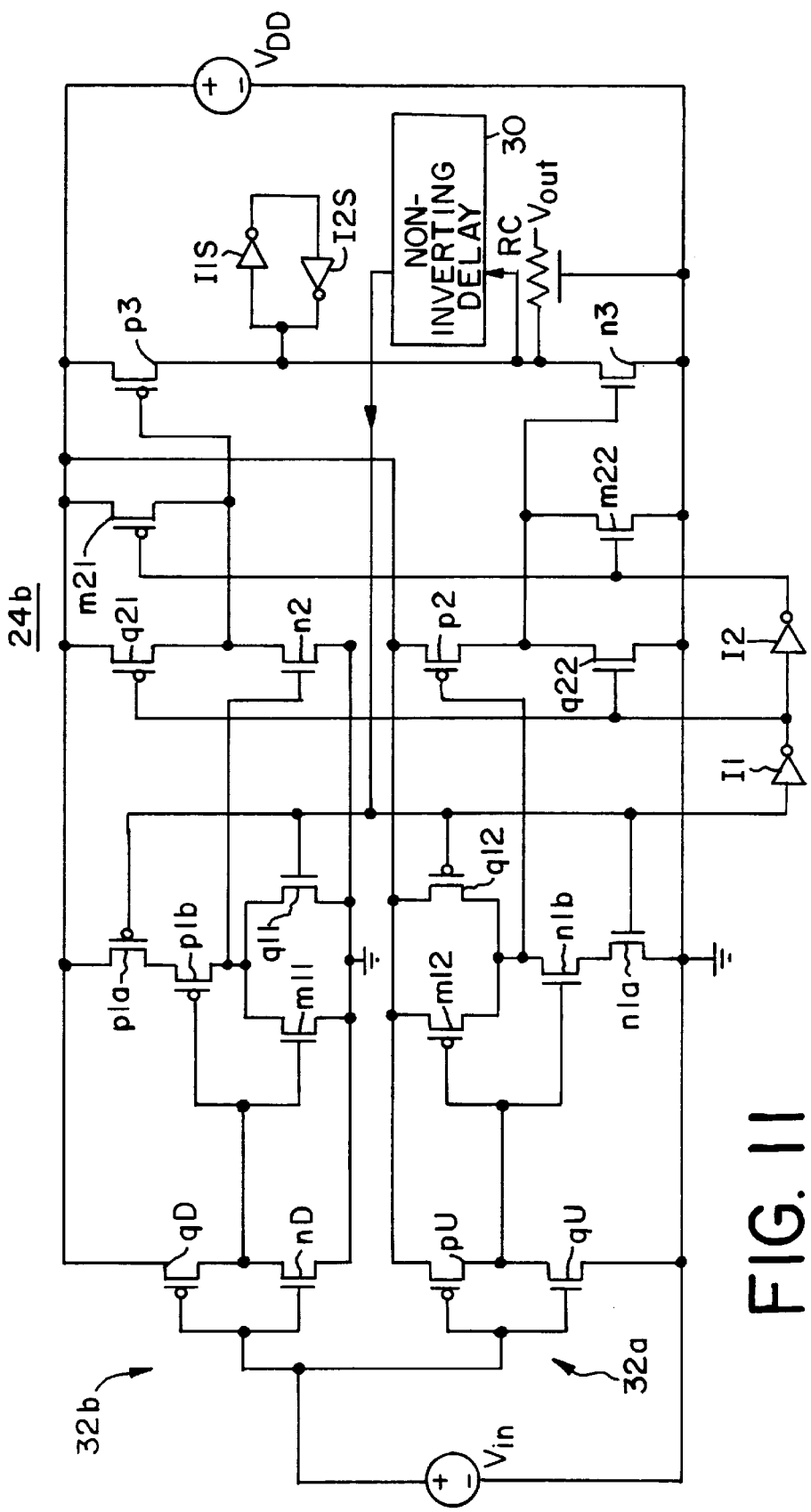
FIG. 11 is a schematic diagram of the HDR buffer circuit similar to FIG. 10 having additional two inverters at the input of the circuit to reduce the line loading.
Figure 12:
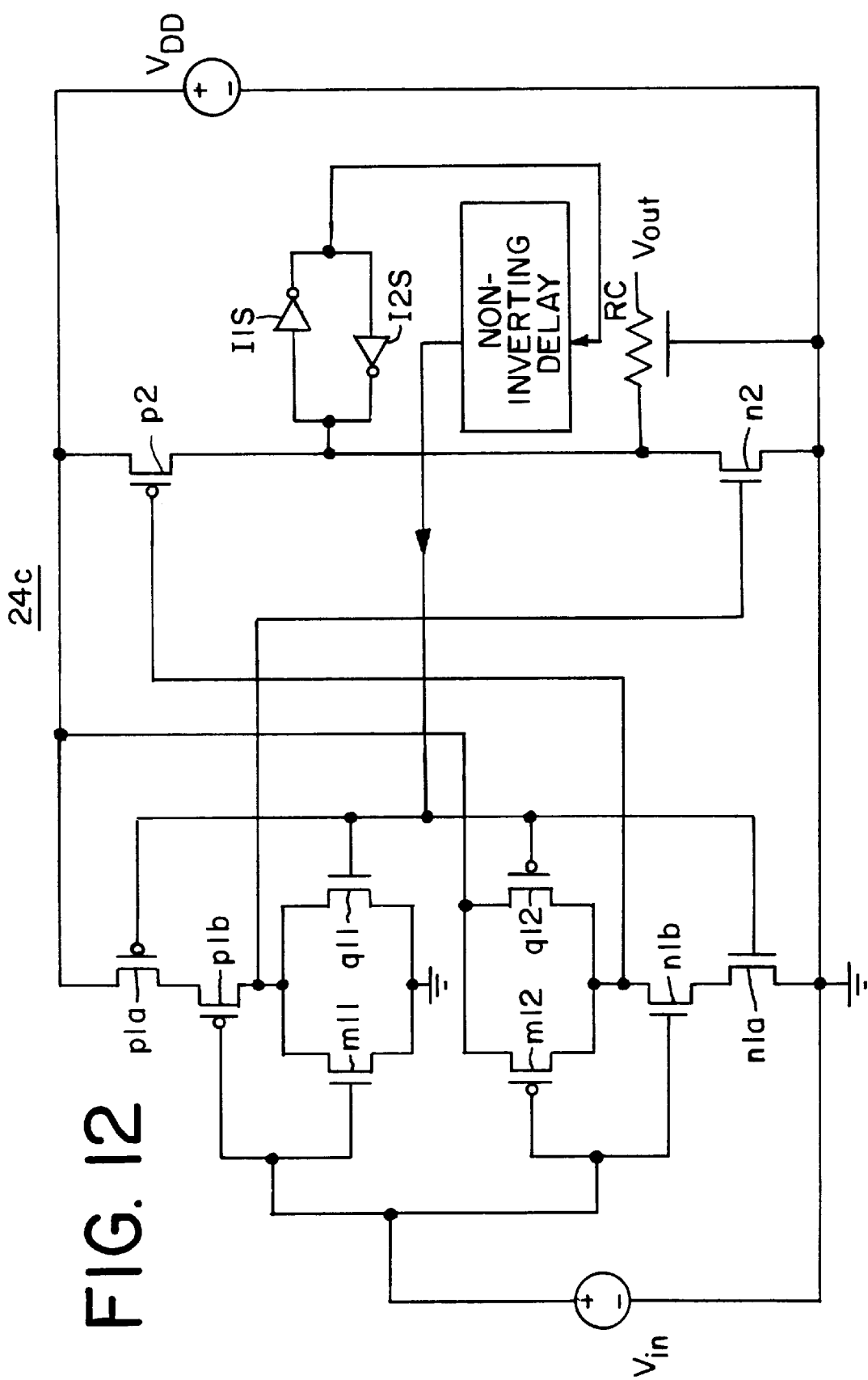
FIG. 12 is a schematic diagram of the HDR buffer circuit in accordance with the present invention showing, for example, two stages in each of the data paths of the circuit.

Referring to FIGS. 10–12, the buffer circuit according to another embodiment of the present invention is shown for restoring distorted, slow signals. This buffer circuit is called herein the HDR buffer. The signal to be restored connected at the HDR buffer input, is restored with minimal delay penalty, and the restored signal is present at the output of the HDR buffer. The HDR buffer can drive a capacitive or resistive capacitive (RC) load connected at the output of the HDR buffer.

The HDR buffer allows on its input unlimited slow transitioning input signals, detects these slow transitioning signals early as the transition progress, and offers an optimal signal transmission from the input to the output, with minimal delay introduced, for a fast response.

Figure 13:
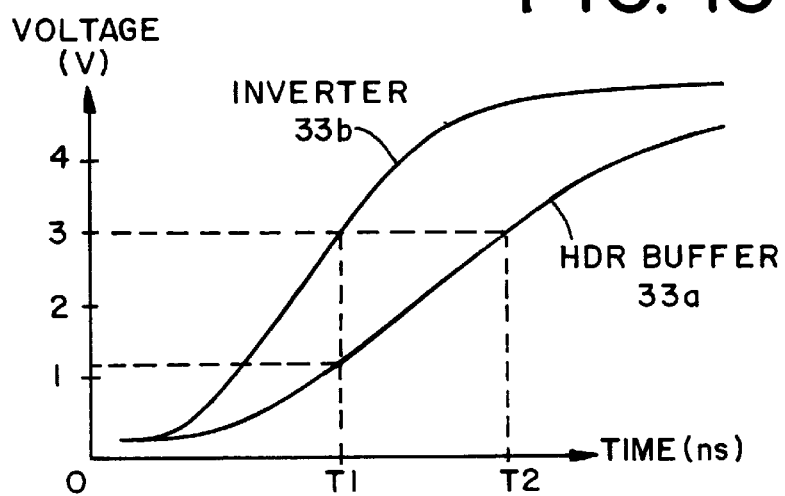
FIG. 13 is a timing diagram of the transitioning signals and switching thresholds for the HDR buffer circuit of FIGS. 10, 11, or 12, and that of a typical inverter.

The typical inverter, as is any stage of the tapered buffer of FIG. 1, designed with the N and P transistors to have the same transconductance, has the typical voltage transfer characteristic (VTC) switching thresholds $V_{IH}$=3V and $V_{IL}$= 2V. This means that for a low to high input transition, the input signal must reach 3V in order for the inverter to switch. As shown in FIG. 13, the inverter waits for a time T1 to switch. If the HDR buffer would detect the transitioning input signal with the same thresholds as an inverter (3V), it would have to wait T2 to switch. T2 could be much larger than T1 for a slow transitioning input signal. Accordingly, the HDR buffer must have a low switching threshold, ideally close to $V_T$ if the threshold sensing circuit is an N transistor, so that it detects the transitioning signal early as the signal starts transitioning. To illustrate the advantage of the HDR buffer, FIG. 13 shows a transition signal 33a at the HDR buffer and that of a typical inverter 33b. The HDR buffer 24a transition signal at a threshold of approximately 1.1V, waiting the same time T1 as an inverter waits to switch at 3V. By switching at a lower threshold, the HDR buffer saves a time equal to T2–T1.

The HDR buffer offers an optimal signal transmission from the input to the output, with minimal delay introduced, for a fast response, to minimally affect the signal path. Accordingly, an optimal buffer circuit for signal transmission, the HD buffer of FIGS. 5–8 or 9, is used in the HDR buffer due to the optimal signal transfer characteristic with the absence of any parasitic capacitances.

FIG. 10 shows an example of an HDR buffer 24a having three stages. The HDR buffer 24a is similar to the HD buffer 10a of FIG. 5 with two stages in each data page (a first and last stage), in which the NAND and NOR gates have maintenance and nulling transistors coupled to their driving transistors P1a, P1b and n1a and n1b, respectively. Stage one of the fast 1 path has a NOR gate 28a having two driving PMOS transistor P1a and P1b, one for each input to the NOR gate, which are serially connected such that the source of transistor P1a is coupled to one of the power rails and the drain of P1a is connected to the source of transistor P1b. An MNT transistor m1 has a source connected to the drain of transistor P1b, the source of an FNT q11 and the gate of the next driving transistor n2 of stage two. The drains of transistors m11 and q11 are connected to ground, i.e., the other of the power rails. The input voltage Vin is connected to the gates of transistors P1b and m11. Stage one of the fast 0 path has a NAND gate 26a having two driving NMOS transistor n1a and n1b, one for each input of the NAND gate, which are serially connected such that the source of transistor n1a is coupled to one of the power rails and the drain of transistor n1a is connected to the source of transistor n1b. An MNT transistor m12 has a source connected to the drain of transistor n1b, the source of an FNT q21 and the gate of the next driving transistor p2 of stage two. The drains of transistors m21 and q21 are connected to the other of the power rails. The input Vin is connected to the gates of transistors n1b and m12.

A feedback loop is provided to the nulling transistors of the HDR buffer circuit 24a. The feedback loop includes a non-inverting delay element 30 having its input connected to output Vout and its output connected to the gates of transistors P1a, q11, q12 and n1a of the first stage of each data path, and to the input of an inverter I1. Inverter I1 represents a first inverter of a chain of serially connected inverters I1 and I2 in which the output of inverter I1 is coupled to the FMT transistors q21 and q22 of stage two and to the input of inverter I1, and the output of inverter I2 is connected to the MNT m21 and m22. For example, delay element 30 may be a clocked latch, or a series of an even number of inverters in which, except for the first inverter, the input of each inverter in the output of the previous inverter. Stage two 28b and 26b of each data path are other wise similar to stage 11a and 11b, respectively, of FIG. 5, and stage three 28c and 26c of each data path is other wise similar to stage 16a and 16b, respectively, of FIG. 5. A small latch 31, similar to latch 21 of FIG. 5, may be provided at Vout. Although three stages are shown in FIG. 10, other number of stages may also be used.

NAND and NOR input gates 28a and 26b are specially sized to obtain the desired $V_{M+}$ and $V_{M-}$ levels. The use of two separate gates 26a and 28b together with a HD buffer-like structure of the other stages in each data path produces a single output Vout, and enables different conditioning of the input signal and obtain the independent, well controlled $V_{M+}$ and $V_{M-}$ levels in one circuit with minimum input to output delay penalty. The HD buffer-like structure permits to reduce the HDR circuit delay to minimum, and to offer a high drive capability, as shown for the HD buffer. Reducing the delay to minimum is important since the HDR circuit is used to restore the signals (in particular when used as a repeater), and any extra delay introduced in the signal path reduces the efficiency of the system. Having a high drive capability allows a fast response for a driven load. The delay element 30 placed in the feedback loop from the output to the input has a major functional role in this structure, permitting the HDR buffer to operate with and restore unlimited slow input signals.

The operation of delay element 30 is described below. For example, suppose an input signal with the transition time from 0 to $V_{DD}$, $T_t=2$ ns, and a buffer delay of D=0.5 ns. Consider a low to high input transition according to FIG. 13 which generates a high to low output transition through the lower branch (fast 0 data path). If the delay element would not exist, after 0.5 ns, the output would find the input in transition, with a voltage level in between states. Accordingly, the upper branch (fast 1 data path) becomes active. The cycle repeats after another 0.5 ns, the buffer output oscillating between states for a total of 1.5 ns, until the input reaches the high state. At that point, the output of the buffer settles in an unknown state. By introducing in the feedback path a delay element with a minimum delay of $T_t$–D (1.5 ns in this example), the above described malfunction is prevented.

Figure 14A:
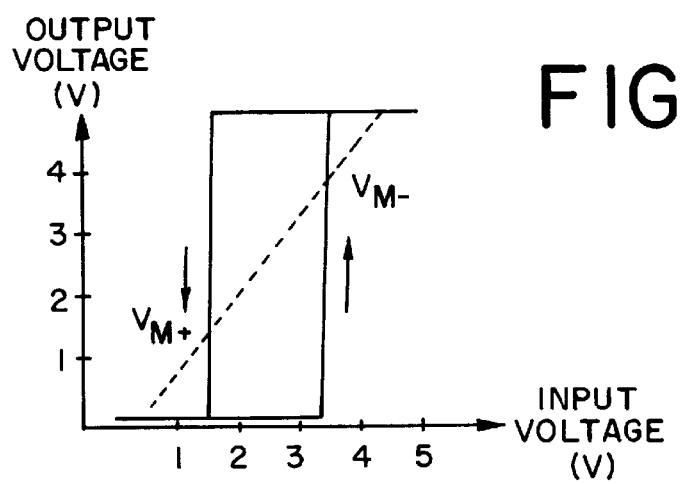
FIG. 14A is a graph of the voltage transfer characteristic of the HDR buffer circuit of FIGS. 10, 11, or 12.
Figure 14B:
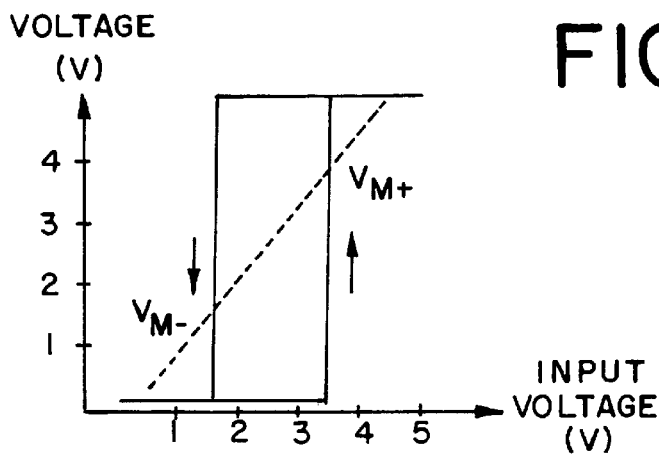
FIG. 14B is a graph of the voltage transfer characteristic of a Schmitt-trigger according to prior art.
Figure 15:
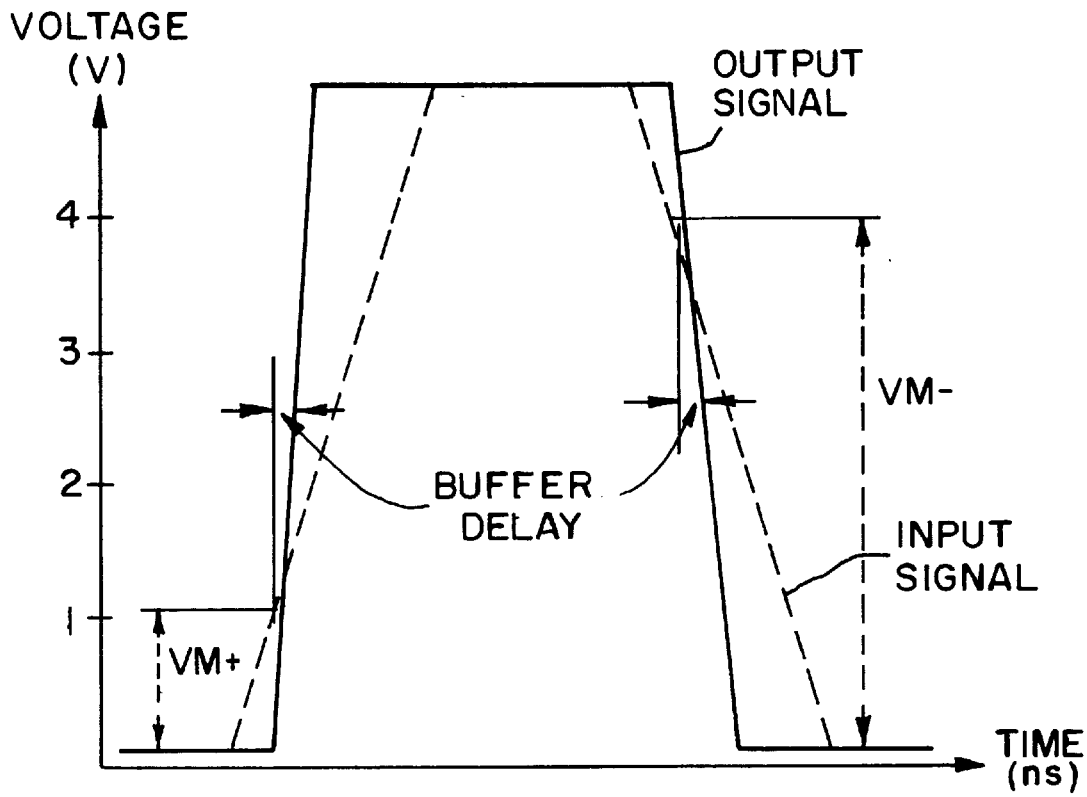
FIG. 15 is a timing diagram of an example of an output response of the HDR buffer circuit of FIGS. 10, 11, or 12 to a slow transitioning signal at the input of the circuit.

The VTC of the buffer circuit of FIG. 10 is shown in FIG. 14A. For comparison, the VTC of a Schmitt trigger is shown in FIG. 14B. The circuit offers thresholds of $V_{M+}$ up to 1V and $V_{M-}$ up to 4V for a process in which $V_T=0.8$V and $V_{DD}=5$V. Note that even if the HDR buffer permits unlimited slow input signals, the short circuit power of the HDR buffer, that could be present for the input gates, is negligible due to the difference in transconductance between the driving (n and p) and nulling (m and q) transistors of these two gates 26a and 28a. The hysteresis in the characteristic, namely the differences between the VTC of an HDR buffer that for a low to high input transition switches for example at 1V, and the VTC of a Schmitt trigger that for a low to high input transition switches for example at 4V. An example of the HDR buffer response to a slow transitioning input signal is shown in FIG. 15.

Several sizing rules are applicable for the HDR buffer 24a. The sizing rules for a HD buffer, as described earlier, are also applicable. Referring to FIG. 10, the desired $V_{M+}$ and $V_{M-}$ thresholds are obtained from the NAND and NOR input gates sizing. The transistors n1a and n1b, as well as transistors p1a and p1b are sized to obtain the desired thresholds, and are much larger than the corresponding nulling transistors m11, q11, m12, and q12. Due to their size, the n1a, n1b, p1a, and p1b transistors give also a fast response to the input signal. The same transconductance for n1a, n1b and p1a, p1b pairs is desired, to ensure the same amplification for the two signal transitions. The delay element could be passive (several inverters connected to introduce the required delay), or active (with latches). The actual implementation depends on the delay value, circuit characteristics, or clock distribution network. If a large delay is necessary, the active implementation is more power efficient. The rest of the circuit is sized according to a HD buffer.

A too large size for transistors n1a, n1b, p1a, and p1b could adversely influence the load the HDR buffer represents for the circuit or for the line that drives the HDR buffer, slowing down this circuit or line. However, due to the low thresholds of the HDR buffer, the transistors n1a, n1b, p1a, and p1b sizes might not influence a great deal the delay to reach these thresholds, but the time until the input signal resolves to the final high (low) state.

One of two approaches may be used to reduce the transistors n1a, n1b, p1a, and p1b sizes. The first approach is a trade-off between transistors n1a, n1b, p1a, and p1b sizes and the buffer delay and driving strength. The thresholds of the input gates $V_{M+}$, $V_{M-}$ depend on the transistors n1a, n1b, p1a, and p1b sizes and the input gates loads (p2 and n2 sizes). Choosing transistors n2 and p2 minimum size, $V_{M+}$ and $V_{M-}$ greatly improves, a desirable effect. Accordingly, the same thresholds as before reducing the transistors n2 and p2 sizes can be obtained by reducing the sizes of transistors n1a, n1b, p1a, and p1b, reducing the load the HDR buffer represents. The drawback is a reduction in HDR buffer driving strength since the last stage of the HDR buffer is reduced, and/or an increase in HDR buffer delay, due to the smaller driving strength or possibly due to the one or two extra stages necessary to drive a given output HDR buffer output load.

The second approach provides the modified HDR buffer circuit 24b, as shown in FIG. 11. Each gate 26a and 28a is driven by an inverter 32a and 32b, respectively, where transistors qU and qD are the nulling transistors, and transistors pU and nD are sized to obtain the desired thresholds $V_{M+}$ and $V_{M-}$. The transistors n1a, n1b, p1a, and p1b role to obtain the desired thresholds is transferred to transistors pU and nD. The advantage is that transistors pU and nD needs to be half the size of transistors n1a, n1b, p1a, and p1b for the same thresholds, since transistors n1a, nib and p1a, p1b were pairs of series transistors. If minimum load for the line is desired, than transistors n1a, n1b, p1a, and p1b are minimum size, to represent a minimum load for transistors pU and nD. Otherwise, transistors n1a, n1b, p1a, and p1b are sized larger for a higher drive capability of the buffer with the same number of stages. Transistors pU and nD are accordingly larger. The delay element 30 role in this configuration is to resolve the output state until the nulling process of pU and nD is completed.

This second approach obtains minimal load for the HDR buffer circuit or for the line that drives the HDR buffer. The drawback is that the nulling process of the input inverters is performed by single nulling transistors (qU and qD). This limits the input signal duty factor, or k in FIG. 4 (the nulling process must be completed before the next transition starts). If for small k this condition is not met, transistors qU and qD must be increased. To maintain the same thresholds, transistors pU and nD must also be increased. A situation may be reached when the HDR buffer of FIG. 10 is more advantageous due to the double nulling transistors used for each stage.

A large HDR delay can increase the signal path delay where the HDR buffer is used, while an insufficient HDR driving power would make the HDR inefficient to drive significant loads. If the HDR delay is significant for the signal path where the HDR circuit is used, than the two-stage HDR shown in FIG. 12 may be used, to reduce the delay. However, the driving strength of the HDR buffer is reduced. If both minimum HDR delay and minimum line loading at the insertion point are desired, a two-stage HDR (FIG. 12) combined with the solution shown in FIG. 11 to reduce the loading the HDR buffer represents should be used.

Figure 16:
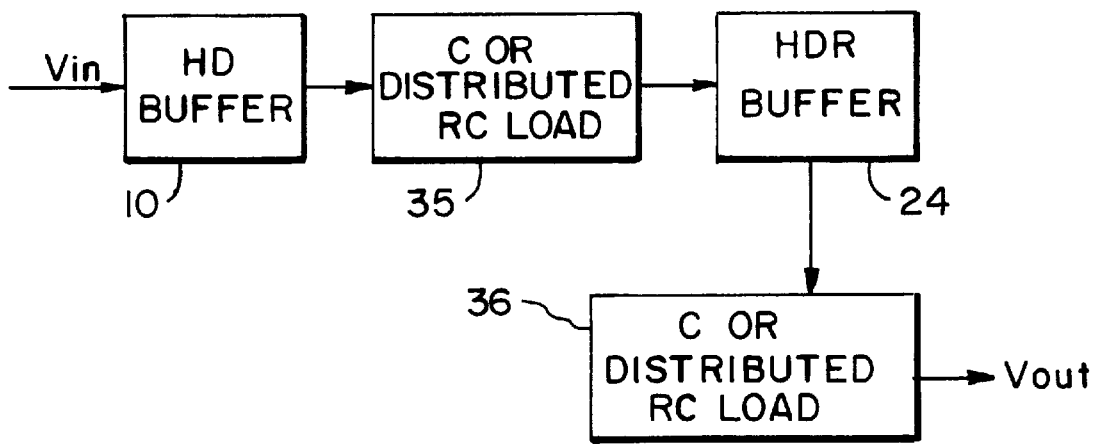
FIG. 16 is a block diagram of a system having a combination of the HD buffer circuit of FIGS. 5, 6, 7, 8, or 9 and the HDR buffer circuit of FIGS. 10, 11, or 12.

The HDR buffer circuit 24a, 24b, and 24c (FIGS. 10–12) may restore slow signals present at the other end of a highly capacitive line that was driven by the HD buffer described earlier, or can restore distorted signals propagated on an RC line. Also, the HDR buffer can drive C or RC loads. A system or buffer circuit 34 having both HD and HDR buffers is shown in FIG. 16. The system 34 includes the HD buffer 10 (10a, 10b, 10c, 10d, or 10e) which receives an input signal Vin and drives a highly capacitive line or load 35. At the other end of the line 35, a distorted signal with slow transitioning edges from the HD buffer 10 is received by HDR buffer 24 (24a, 24b, or 24c). This slow transitioning signal may be restored with minimum delay and power penalty by the HDR buffer 24 driving a C or distribute RC load or line 36 at an output Vout.

Figure 3:
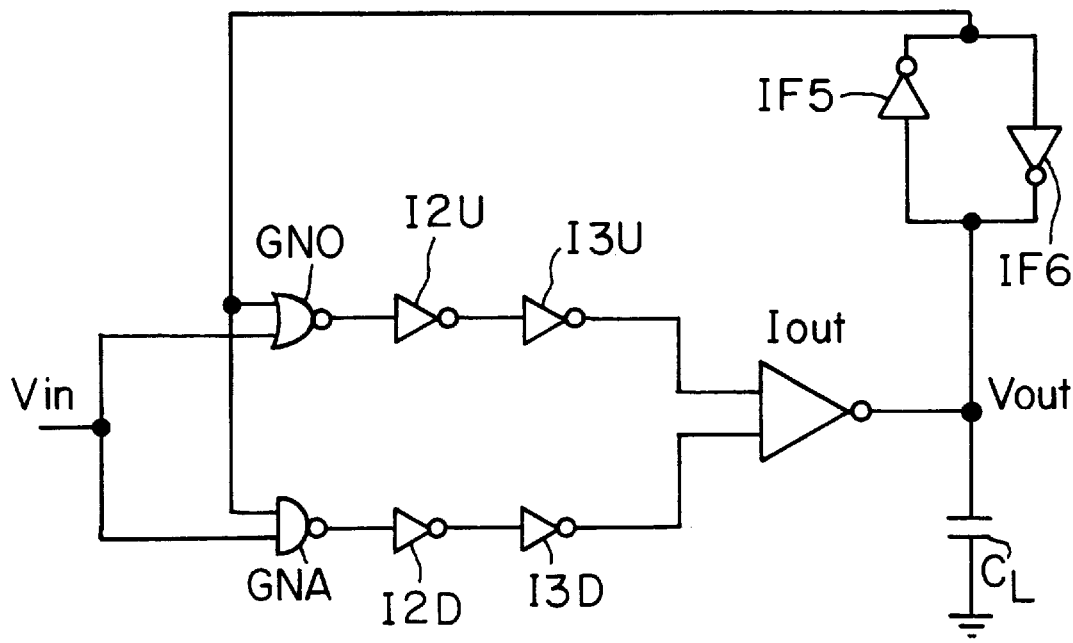
FIG. 3 is a schematic diagram of another digital buffer according to prior art.

One example of the application of system 34 is that a smaller HD buffer 10 can be used to reduce power dissipation and conserve area usage, rather than a large HD buffer. However, the use of a smaller HD buffer may effect the buffer's speed, resulting in an output signal from the buffer which transistions slower than desired. By using the output signal from the HD buffer as the input signal to the HDR buffer 24, the HDR buffer can restore the signal's transistions to a higher speed which may be equal or near the transition speed of the original signal received by the HD buffer 10 in the system. The combination of the two buffers 10 and 24 under the earlier described sizing conditions can save significant power and area, especially for high frequency signals, as compared to prior art buffers of FIGS. 1–3.

Figure 17:
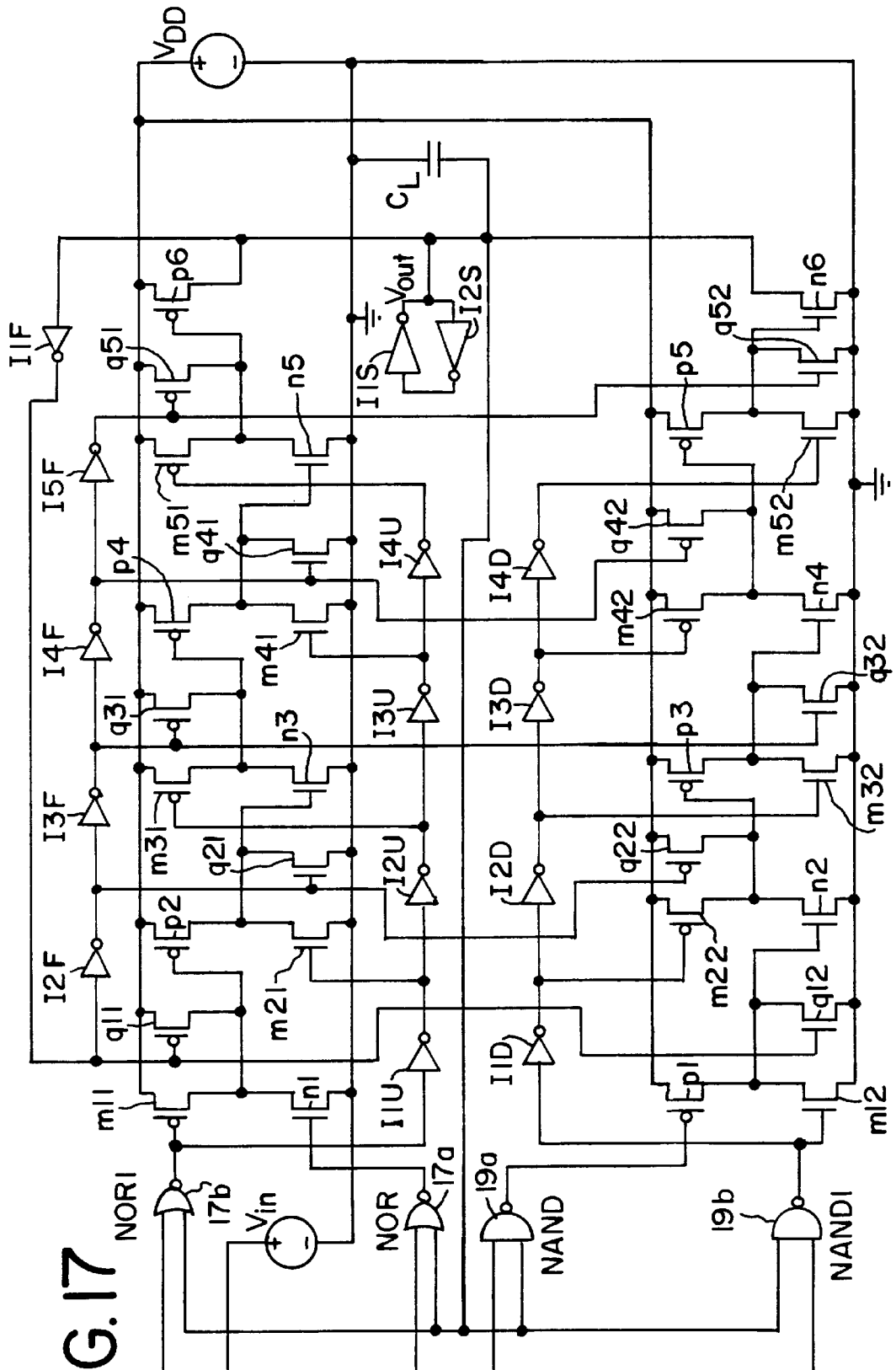
FIG. 17 is a schematic diagram example of a HD buffer circuit similar to FIG. 5 showing double input gates to separate driving of the first stage in each of the data paths of the circuit.
Figure 18:
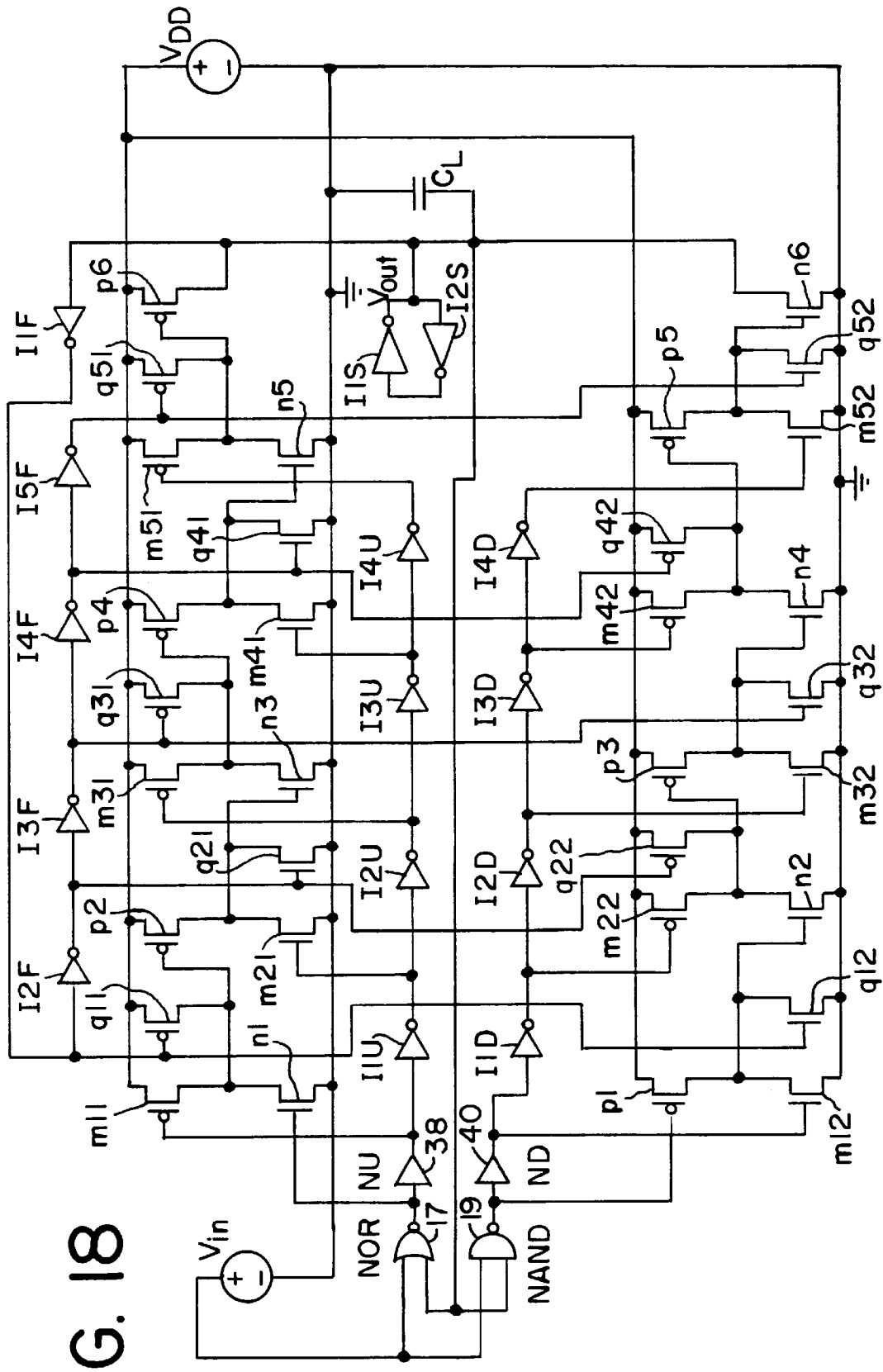
FIG. 18 is a schematic diagram example of another HD buffer circuit similar to FIG. 5 showing separated driving of the first stage in each of the data paths of the circuit.
Figure 19:
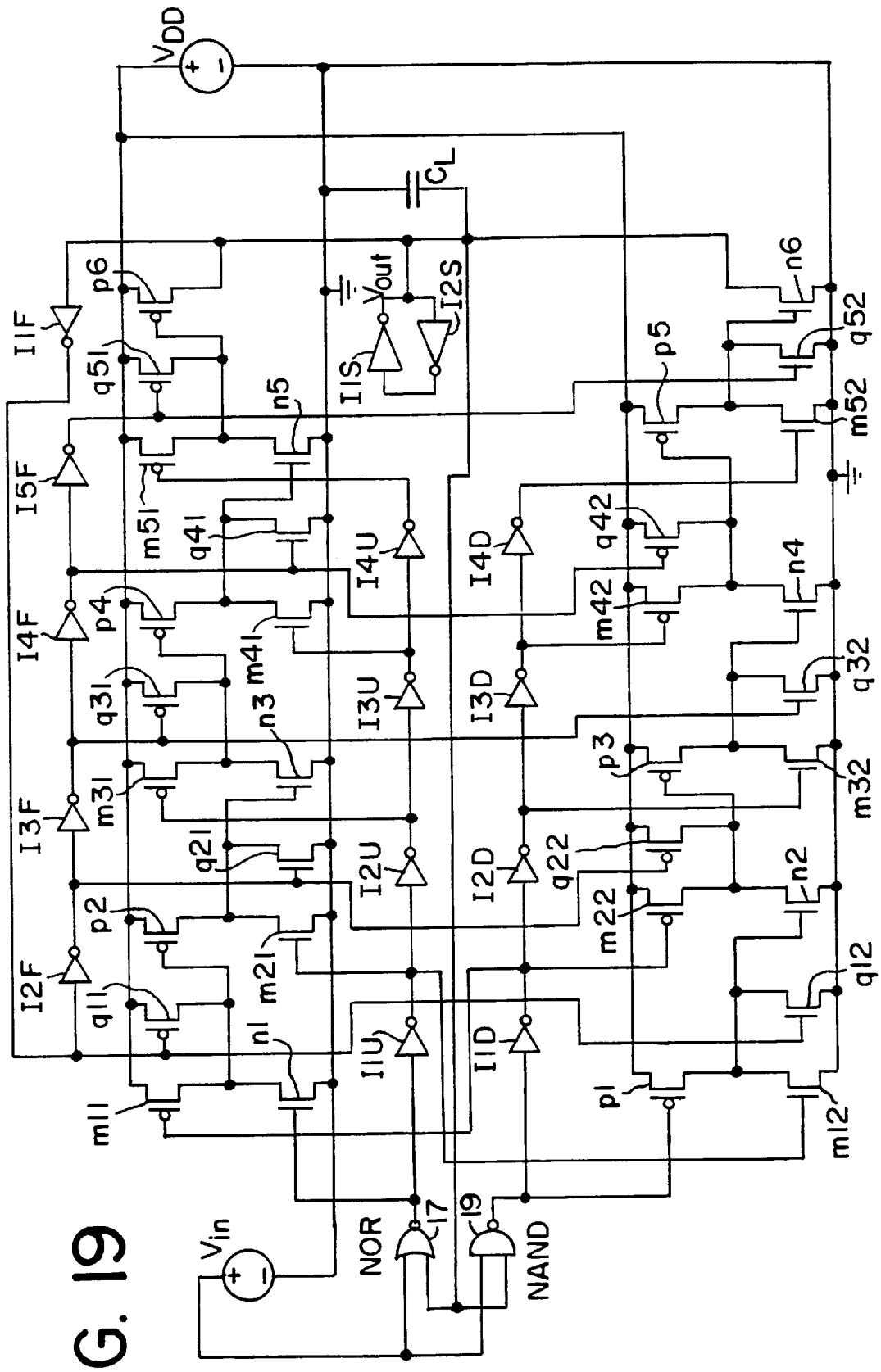
FIG. 19 is a schematic diagram example of another HD buffer circuit similar to FIG. 5 showing separated driving of the first stage in each of the data paths of the circuit.

In the HD buffer circuits of FIGS. 5–9, the gate of the driving (amplifying) transistor of the first stage, transistor n1, is connected to the gate of the maintenance nulling transistor (FIGS. 5, 6, and 9), or if the first stage does not have double nulling transistors for the first stage (small frequencies of the input signal) to the fast nulling transistor (FIGS. 7 and 8). This is adequate for the first stage due to the size of the maintenance or even fast nulling transistor (for small frequencies of the input signal) for this first stage, which would not represent a significant parasitic capacitance to increase the delay and the power dissipation of the signal path. HD buffer circuits to eliminate this gate to gate connection and the associated parasitic capacitance by the input gate separation are shown in FIGS. 17, 18, and 19. FIGS. 17–19 are identical to the HD buffer of FIG. 5, except for the input gate configuration.

In the HR buffer example of FIG. 5, the load of the NOR (similarly NAND) gate consist in the gate capacitance of the transistors n1, m11 and I1U. Since the NOR gate is part of the signal path, this load, that could be significant, might affect the speed of the data path. This problem is eliminated in FIG. 17, where the NOR gate 17a of the signal path drives only transistor n1, while the rest of the hardware dedicated to nulling transistors driving is driven by the parallel NOR1 gate 17b. Similarly, the NAND gate 19a of the fast 0 data path drives only transistor p1, while the rest of the hardware dedicated to nulling transistors is driven by the parallel NAND1 gate 19b. One drawback is an extra load represented by the NAND1 and NOR1 gates for the signal source.

Referring to FIG. 18, other means for gate separation is shown by the insertion between the output of the NOR 17 gate and inverter I1U of a noninverting delay element NU 38 (such as an even numbered chain of two inverters), and insertion between the output of the NAND 19 gate and inverter I1D of a noninverting delay ND 40. The NOR gate for example drives only the gate capacitance of transistor n1 and noninverting delay element NU. The disadvantage of this solution is a reduction in the time allocated to the nulling process for all stages by the NU and ND delay, respectively, which could be important for high frequencies of the input signal. Another disadvantage, albeit minimal, is the crowbar current produced between transistors n1 and m11 (q11 if this solution is implemented for the schematics in FIGS. 7–8) for the duration of NU delay, if the NOR gate path is discussed.

Yet another means for gate separation for the first stage is shown in FIG. 19, which requires no extra hardware. Inverter I1D drives transistor m11, and inverter I1U drives transistor m12. The disadvantage herein, albeit minimal, is that the crowbar current between for example transistor n1 and m11 (q11 for FIGS. 7 and 8) is present for the entire duration for which the fast 1 path is driven.

Figure 20:
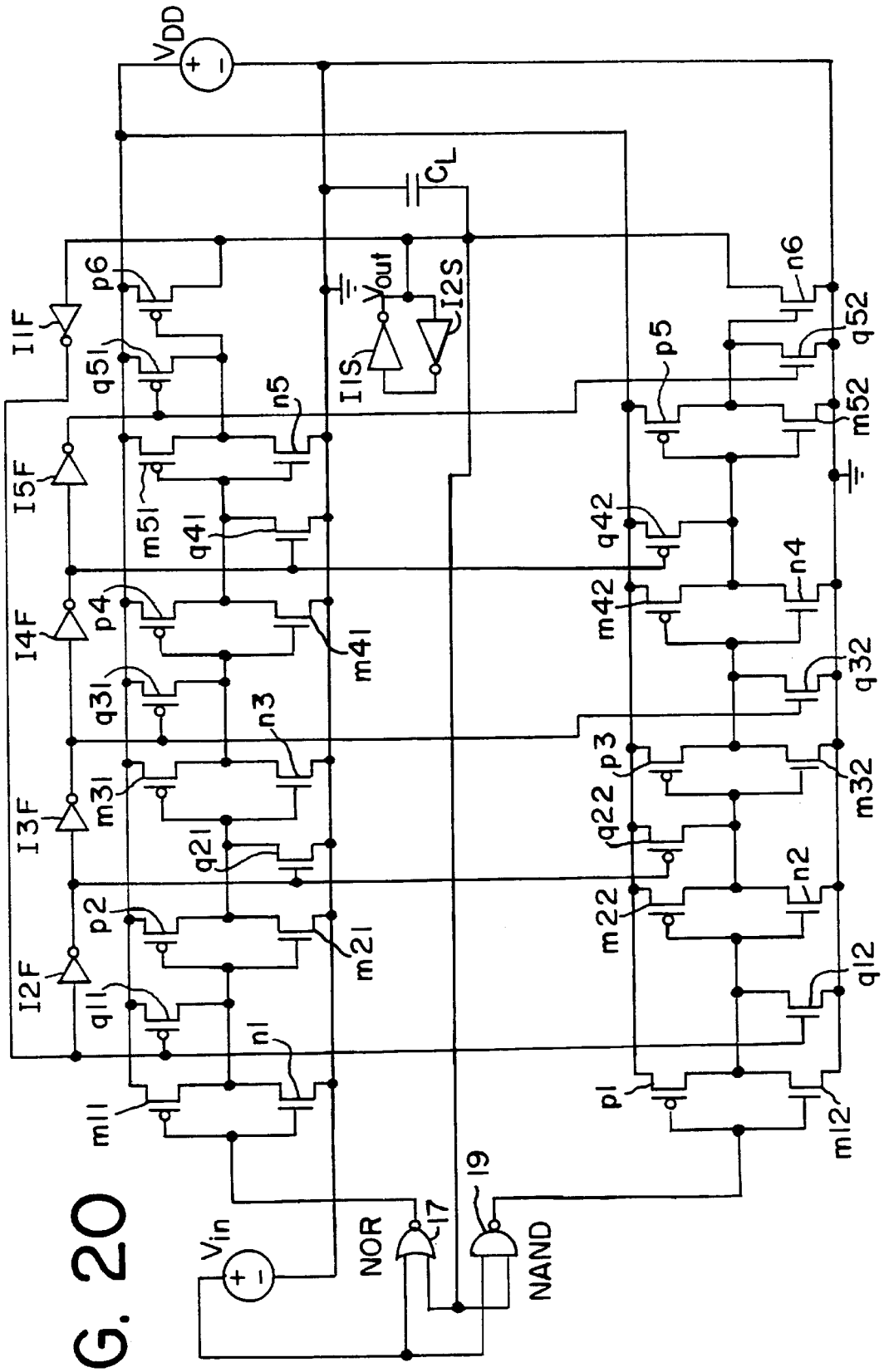
FIG. 20 is a schematic diagram example of a HD buffer circuit similar to FIG. 5 without the two chain of inverters to the maintenance nulling transistors of the circuit.

Since the MNT transistors are minimally sized independent of the frequency of the input signal, the signal path delay is not significantly influenced even if their gates are connected to the corresponding driving transistor gates for each stage. Accordingly the chain of inverters I1U–I4U and I1D–I4D of FIG. 5 can be removed, as shown in FIG. 20. However, the speed of the data path is accepted to be affected (albeit minimal, the use of double nulling transistors for each stage of the buffer of FIG. 20 is necessary. In this way, the MNT transistors can be maintained minimal size independent of frequency, while the FNT transistors are independently sized to complete the nulling process of each stage in the time that is allocated according to the input frequency. A reduction in hardware is provided at the expense of a minimal delay.

In FIG. 5 for example, each of inverters I1F–I5F as well as possibly inverters I1U–I4U and I1D–I4D must introduce a delay as discussed earlier. For a larger delay as well as for transitions with sharper edges at the output of each inverter (if necessary), each inverter can be replaced with a chain of three serially connected inverters: the first inverter is small and drives a second inverter which is large so that it represents a large load for the first inverter to obtain the required delay. Finally, the second inverter drives a third inverter (or a Schmitt-trigger) that produces sharp transition edges for driving the nulling transistors. The third inverter is sized to efficiently drive the nulling transistors, as discussed.

Figure 21A:
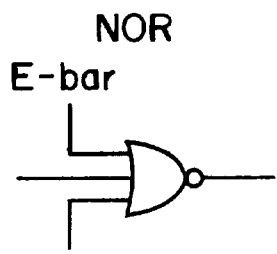
FIGS. 21A, 21B, and 21C are schematic diagrams showing the NAND gate, NOR gate, and output latch, respectively, of the HD and HDR buffer circuits of FIGS. 5–9 and 10–12, respectively, to tri-state the operation of the buffer circuits.
Figure 21B:
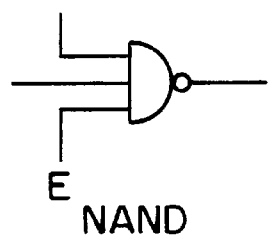
Figure 21C:
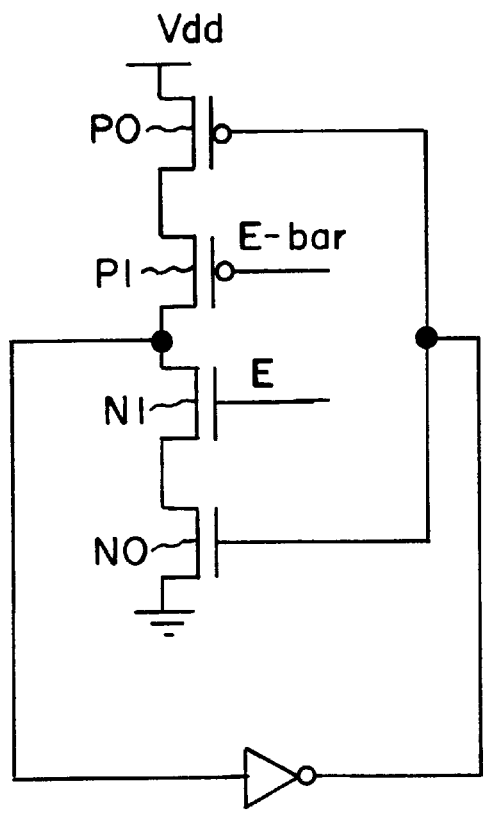

Referring to FIGS. 21A–21C, any of the discussed HD or HDR buffers of FIGS. 5–9 or 10–12, respectively, may be tri-stated. To tri-state any of the buffers, the two-input NAND and NOR gates present at the input of the respective buffer become three input NAND and NOR gates, where the third input of the NAND gate is controlled by the E (enable) signal and the third input of the NOR gate is controlled by the E-bar (Enable negated) signal, as shown in FIGS. 21A–B. Also, the output latch that maintains the output state is tri-stated using the same E and E-bar signals as shown in FIG. 21C. The buffer is tri-stated when E=low. The size of the three-input NAND and NOR gates meet the particular sizing considerations as discussed for the respective type of buffer. The size of the transistors N0, N1, P0, and P1 transistors are double in size to insure the same transconductance as for the equivalent inverter.

In a further embodiment, a buffer circuit based on the HD or HDR buffers can be provided for driving highly resistive RC interconnect lines. The buffer of this embodiment is referred to herein as a Transparent Repeater (TR) buffer.

Figure 22:
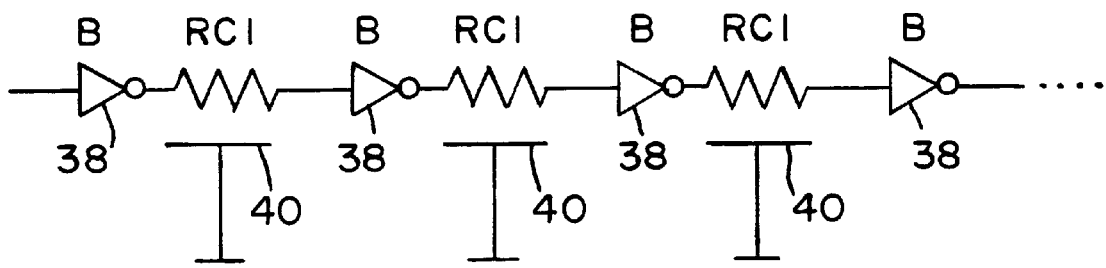
FIG. 22 is a schematic diagram showing the insertion of repeaters for a highly resistive RC line according to the prior art.

FIG. 22 shows the typical buffer inserted for a highly resistive RC interconnect line. The initial distributed RC line is optimally partitioned ink equal $RC_1$ segments 40, each segment being driven by a buffer 38 (B). The delay and power dissipation necessary to drive the initial RC line is therefore optimized. The total delay of the line can be therefore written as $$D = K(D_1 + D_B) \qquad (6)$$

where $D_1$ is the delay introduced by an $RC_1$ segment, and $D_B$ is the delay introduced by a buffer B. The k buffers introduce a total delay equal to $kD_B$.

Figure 23:
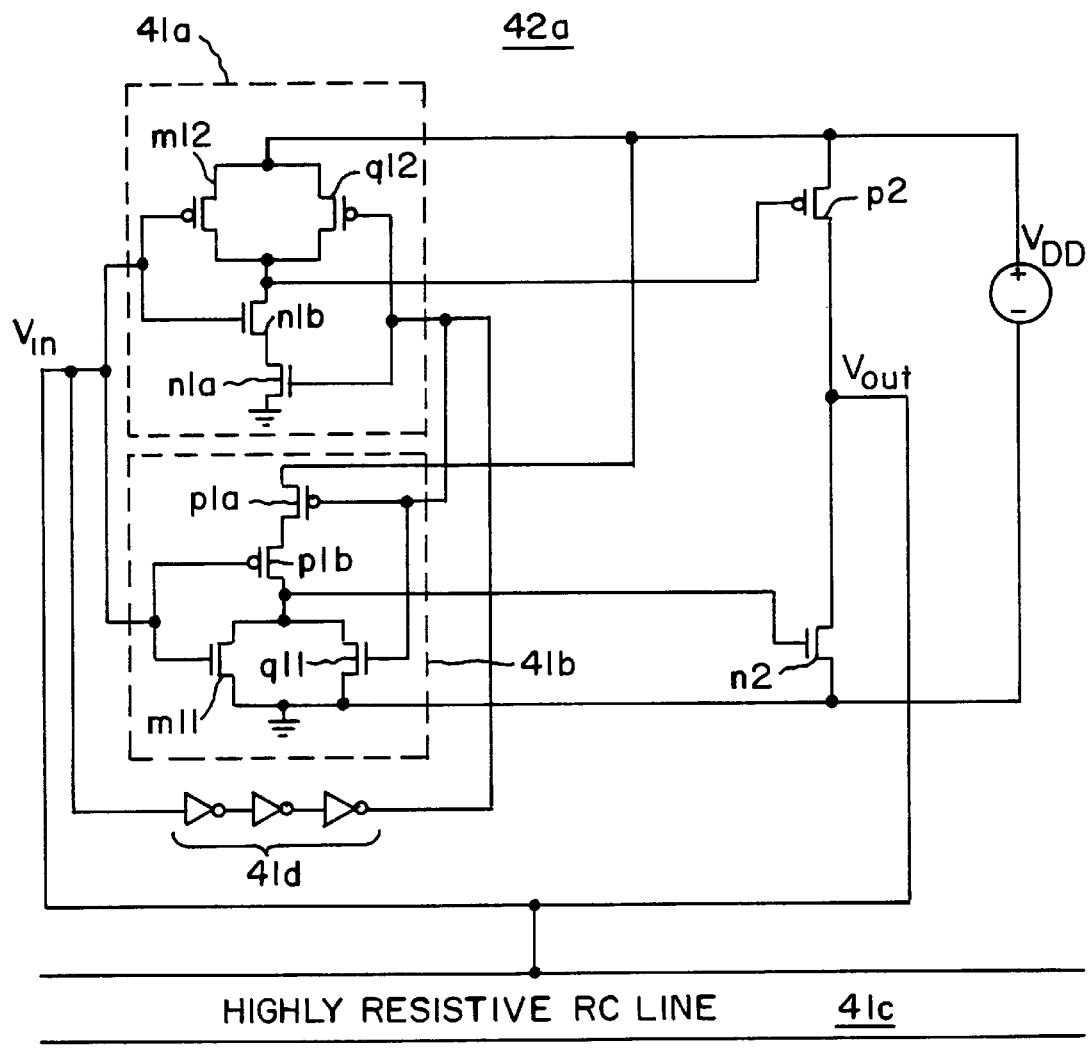
FIG. 23 is a schematic diagram of another buffer circuit in accordance with the present invention, referred to as a TR buffer, for driving a highly resistive RC line.
Figure 24:
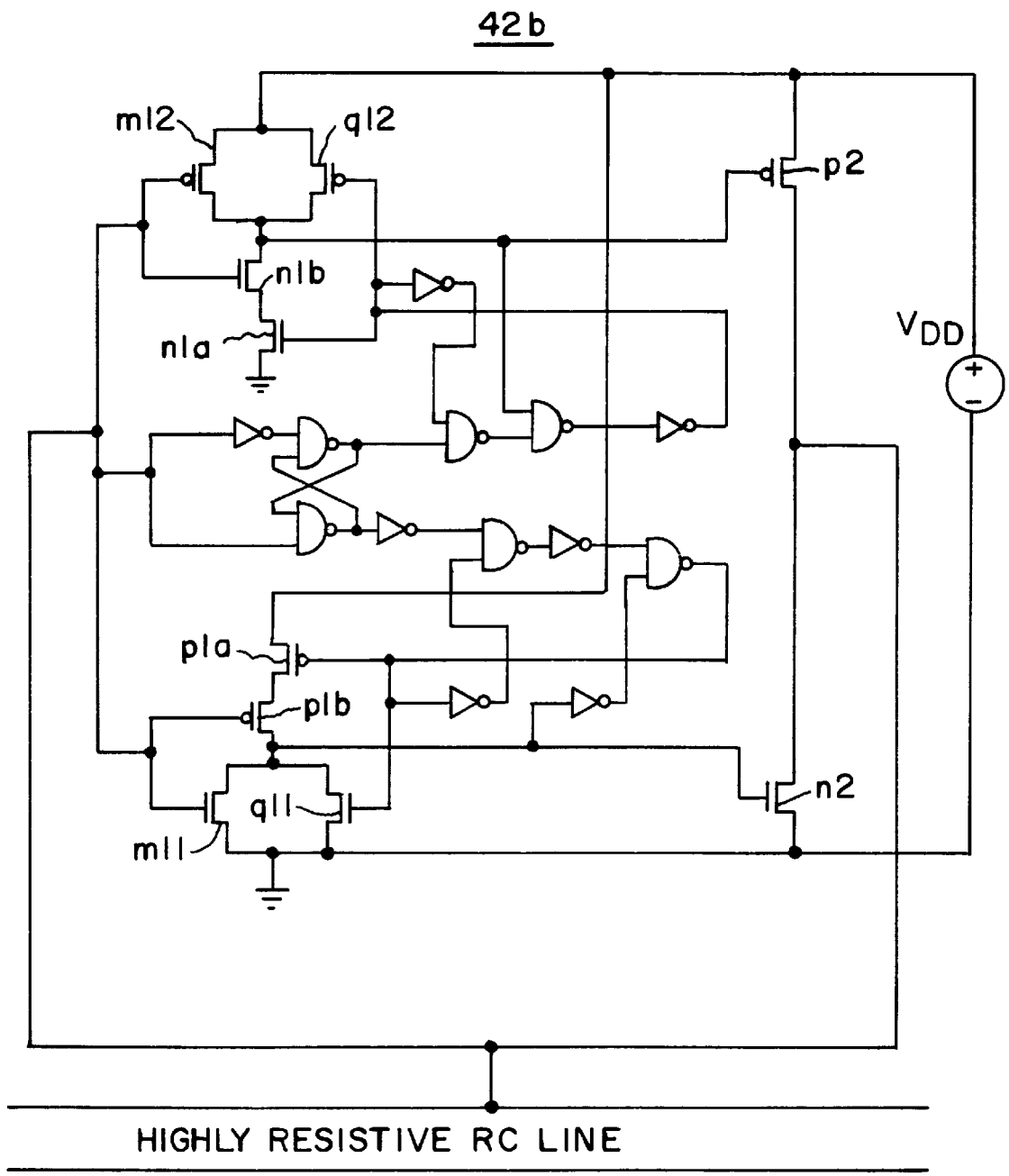
FIG. 24 is a schematic diagram describing a TR buffer circuit similar to FIG. 23 that starts the nulling process to tri-state the final stage of the buffer circuit through a combinational logic circuit between the input of the buffer circuit and an internal signal of the buffer circuit.
Figure 25:
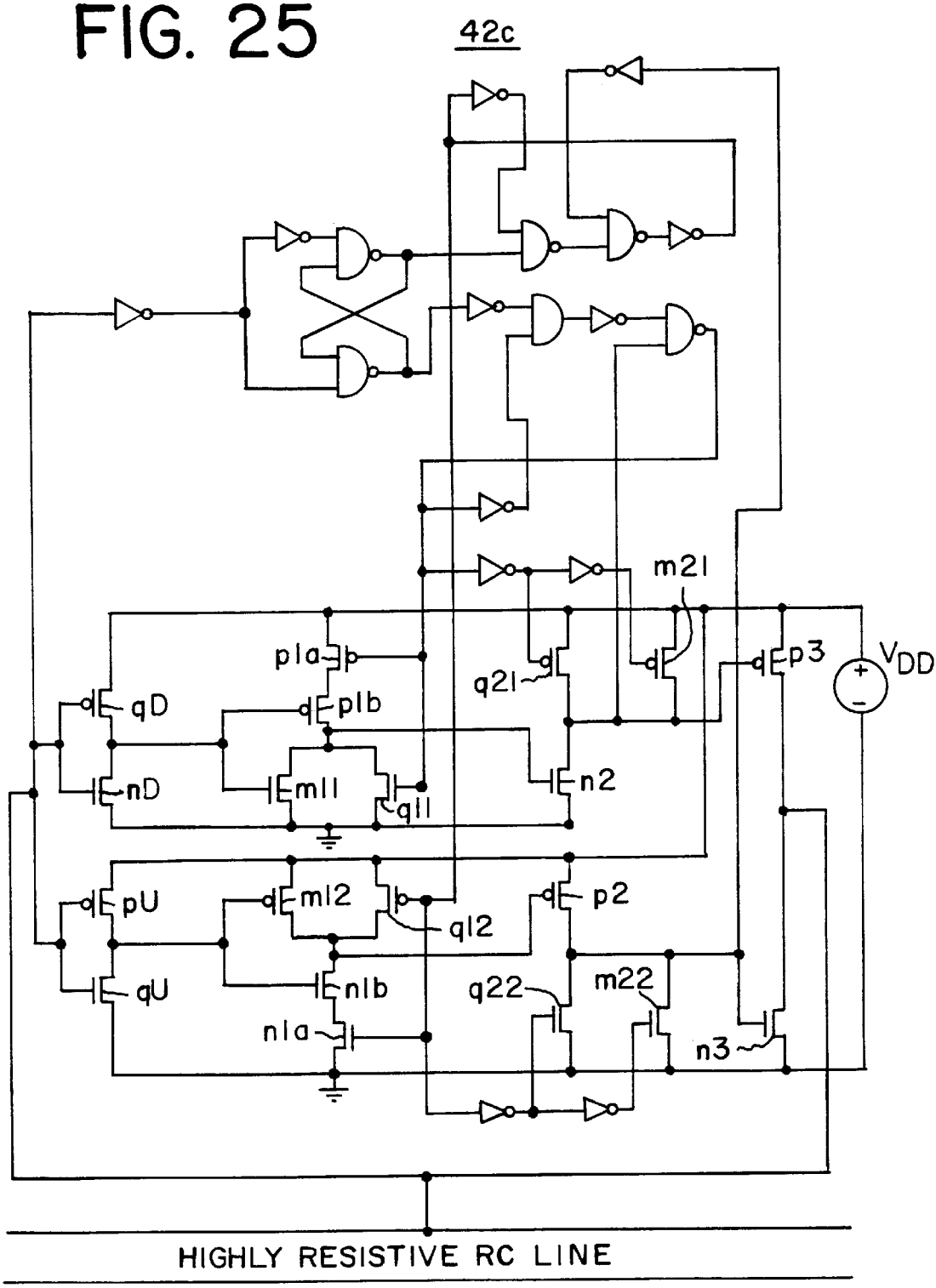
FIG. 25 is a schematic diagram describing a TR buffer circuit similar to FIG. 23 having inverters similar to the HDR buffer of FIG. 11 at the input of each data path of the circuit for reducing line loading.

Referring to FIGS. 23–25, the TR buffer 42 is shown which substantially reduces or eliminates the $kD_B$ delay. The TR buffer detects a low-to-high or high-to-low transition on the highly resistive RC line, produces an amplified same sense transition at the output (respectively low-to-high output transition for a low-to-high input transition and high-to-low output transition for a high-to-low input transition), and tri-states itself by auto-shutting-off the final transistors through the nulling process while preparing the input for the next input transition. The output is on only approximately for the duration of the nulling process. The TR buffer is similar to the HDR buffer, described earlier, having two stages in each data path, but has no feedback path, no output latch, and the output and input of the buffer are connected to each other and to a highly resistive RC line 41c, such as an interconnect data line of a chip having both resistance and capacitance. The input NAND gate represents the first stage 41a of the fast "0" data path and the input NOR gate represents the first stage 41b of fast "1" data path, and are similar to NOR and NAND gates 28a and 26a of FIG. 10. The input Vin is connected to the gates of driving transistors n1b (first input of the NAND gate) and p1b (first input of the NOR gate), and the gates of maintenance nulling transistors m11 and m12. A series of delay elements, such as inverters 41d, are connected between the input Vin (and output Vout) of the buffer and the gate of driving transistor n1a (second input of the NAND gate) and p1b (second input of the NOR gate), and the gates of fast nulling transistors q11 and q12. In other words, one of the inputs of the NAND and NOR are controlled by a signal derived from the output of the buffer via a delayed signal derived from the input of the buffer.

After a signal appears at Vin, depending on the state of the signal (1—approximately 5V or 0—approximately 0V), the signal propagates to Vout through by turning on the driving transistors of either the fast 1 path, driving transistor p1b and n2, or the fast 0 path, driving transistors n1b and p2, by turning ON. The driving transistors amplify the signal on the RC line 41c as both Vin and Vout are connected to the line. The buffer then enters a tri-state (a signal in a range intermediate 0 and 5V) at Vout, via the delayed signal from Vin through inverters 41d to the other driving transistor n1a or p1, which turns off the driving transistors which were propagating the signal to Vout. This resets the TR buffer to receive the next signal at Vin on the RC line 41c. As in the HD and HDR buffer, the nulling transistors of the TR circuit operate to eliminate the parasitic capacitance.

Proper timing of the TR buffer 42a to propagate and tri-state may be controlled by sizing of the transistors in the circuit, such as described earlier. To further control the time to tri-state the buffer, the signal that starts to tri-state the output stage of the propagating data path may be controlled through a combinational logic circuit between the input Vin and the signals that controls the gates of the driving transistors n2 or p2, as shown in the example of the buffer circuits 42b and 42c of FIGS. 24 and 25, respectively. The latch shown in circuits 42b and 42c is used to prevent oscillation due to feedback signals from the gates of the final transistors to the input of the combinational circuit. Thus, the output of the buffer is tri-stated after the output transistors were turned on, eliminating any uncertainty as to when the driving transistor of the final stage tri-states. The buffer circuit 42c of FIG. 25 also includes an inverter between the input and first stage of each data path to provide minimal line loading as similarly used in the HDR buffer 24b of FIG. 11. Low detection thresholds as for the HDR buffer can also be incorporated into the TR buffer 42a, 42b, or 42c, improving the response speed.

Figure 26:
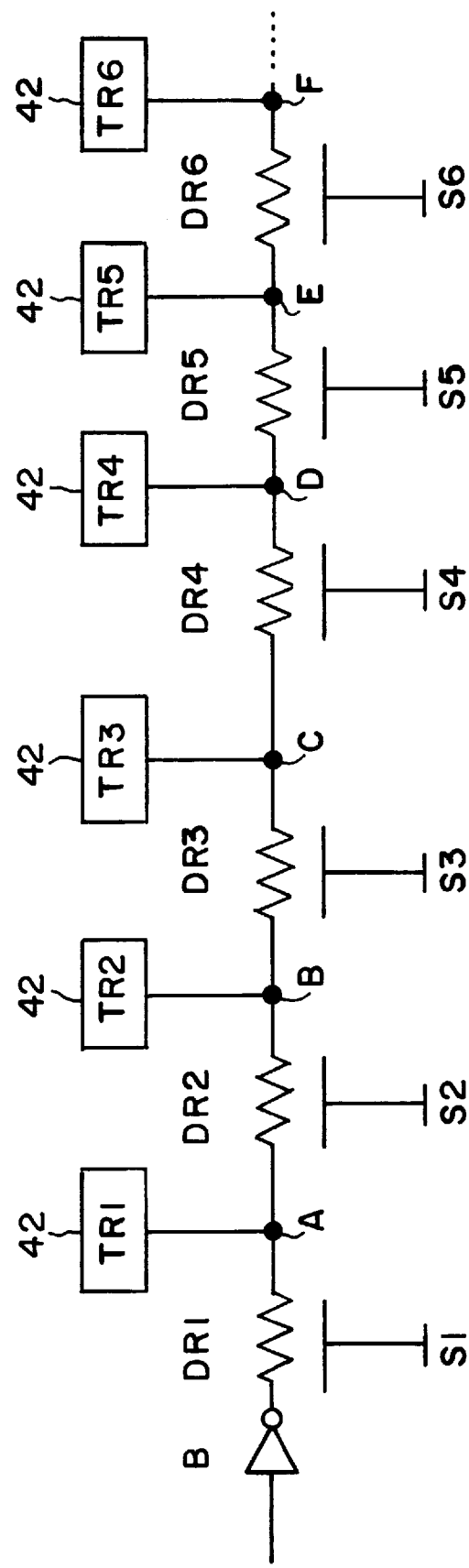
FIG. 26 is a schematic diagram of a system showing the insertion of the TR buffer circuit of FIGS. 23, 24, or 25 at multiple locations along a highly resistive RC line.

The TR buffer 42a, 42b or 42c (42) may be inserted at several different locations along an RC line, as shown in FIG. 26. Each TR buffer is denoted as TR1, TR2, and so forth. Although only six TR buffers are shown, other numbers of the repeaters may also be used. For example, to exemplify the insertion of the TR buffer, when the TR buffer has the same switching thresholds as the B buffer, consider $D_1$ of FIG. 22 equal to 0.1 ns, and the TR buffer delay (from the input transition detection to the output full response) equal to 0.3 ns. The distributed RC line is considered uniform, meaning that the length of a segment of the line is proportional to the delay that is introduced by that segment.

Initially, all the TR buffers are off, and the buffer B drives the entire line alone. After $DR_1=D_1=0.1$ ns, the TR threshold is reached in A, and activates the first TR that will have the output active after 0.3 ns. The signal further propagates in B, C, and D through the line segments S2, S3, and S4. TR buffers are inserted at B, C, and D, where $DR_2=DR_3=DR_4=0.1$ ns. However, the length of the line segment S4 is smaller than the length of the line segment 3, which is smaller than the length of the line segment S2, which finally is smaller than the length of the line segment S1 due to the characteristics of the signal propagation on an RC line. When the signal reaches the TR threshold in D, TR4 is activated, TR3 and TR2 are progressively closer to the moment when their output becomes respectively active, while the output of the TR1 just becomes active. The current provided by the output of TR1 enhances the driving strength of the line (similarly to moving the driver B in A), and accordingly increases the length of the segment S5 to provide a delay equal to 0.1 ns, as compared to the length of the segment S5 that would result for a 0.1 ns when only buffer B would be active. After 0.1 ns, when the signal reaches E and TR5 is activated, the output of TR2 becomes active and enhances the driving strength of the line in B, adding a new segment of the line to introduce a delay equal to 0.1 ns from E to F, and the cycle repeats like dominos. While segments S1, S2, S3, and S4 decreases in length, S5, and S6 increase, while after a certain rank become approximately constant in length.

The $kD_B$ delay of FIG. 22 is practically eliminated if the delay of TR1 is equal to $D_1$. However, if the delay of TR1 is much larger than $D_1$, the advantage of using TR buffers and this insertion method disappears, since the line segments become smaller and smaller for the same $D_1$ introduced until the first TR buffer becomes active and also the length of the line segment that is added from activating one TR buffer to the next TR buffer is also smaller. For example, if the initial line of FIG. 22 was partitioned in k segments, the line using TR buffers is partitioned in (k+p) segments, and the total line delay is $$D_{TR}=D_1(k+p) \qquad (7)$$

A gain is noted if $$D_1 p \leq D_B k \qquad (8)$$

The gain decreases as the number of p segments increases, which depends on the TR buffer delay.

One situation when the use of a TR buffer is not efficient is when the delay of the line driven only by the buffer 42 is similar to the TR buffer delay. This situation implies that by the time when the output of the first TR buffer TR1 becomes active, the signal reaches the end of the line. Accordingly, the TR buffer must provide minimal delay, while providing high output driving strength. These qualities may be provided by the earlier described HD buffer.

The TR buffers may incorporate low switching thresholds as described for an HDR buffer. If these low switching thresholds TR buffers are used to drive a highly resistive RC line as shown in FIG. 26, then, as discussed for FIG. 13, if the same delay $D_1$ (or $T_1$ in FIG. 13) is maintained for the TR buffer to reach the low switching thresholds as for the B buffer to reach the B thresholds, then, the length of the segment of the line where the low switching threshold is reached is larger than the length of the segment of the line where the B threshold is reached. Accordingly, the line may be partitioned in less segments, possibly less segments than k. If m is the number of segments in which the line that uses TR buffers with low thresholds is partitioned, than, the total delay of the line is $$D_{TR}=mD_1 \qquad (9)$$

and the gain in delay as compared to the classical repeater insertion is $$G=(k-m)D_1+D_B k \qquad (10)$$

Multiple trade-offs exist to improve the response and increase the gain of the TR buffered line, such as for example to use TR buffers with low thresholds and increased final stage as compared with a B buffer (for increased output driving strength), together with line partitioning in less segments, or combined use of low thresholds TR buffers and normal threshold TR buffers.

The CMOS buffer circuit topology of this invention is appropriate to be used in digital circuits. The HD buffer circuit of this invention improves speed and power dissipation for driving large capacitive loads. The HDR buffer circuit provides for restoring slow transitioning digital signals which may be coupled to the output of a HD buffer circuit or for driving C or RC loads. The TR buffer circuit is capable of driving highly resistive RC interconnect lines. Multiple trade-offs are possible between speed, power dissipation and area, accommodating a multitude of design goals. If power is the main objective, the buffers can be designed to reduce the intrinsic power dissipation to a minimum, preserving the speed of an optimal speed tapered buffer and offering significant area savings.

The elimination of parasitic capacitances at the output of each stage by the nulling transistors in the HD, HDR, and TR buffer circuits enables the optimal performance of the buffer circuits interms of speed, area (input gate and transistor size) and power dissipation. By proper sizing of the input gates and transistor of the buffer circuits, the elimination of parasitic capacitances provides a minimal delay on the signal paths between the input and the output of the buffer, offering maximum driving strength for the buffer load, optimal signal amplification from stage to stage, while reducing to minimum the dynamic dissipated power. The buffer circuits may also eliminate or reduce any crowbar current for the stages of the buffer, thereby reducing their DC and short-circuit dissipated power. Further, by eliminating the parasitic capacitances present at the output of any stage, the performance of the buffer circuits are independent of the frequency of the input signal received.

From the foregoing description, it will be apparent that improved digital buffer circuits have been provided. Variations and modifications in the herein described buffer circuits in accordance with the invention will undoubtedly suggest themselves to those skilled in the art. Accordingly, the foregoing description should be taken as illustrative and not in a limiting sense.

What is claimed is:

1. A buffer circuit comprising:
   a plurality of stages in the direction of input to output of the circuit defining two data paths representing a first data path for a "1" state and a second data path for a "0" state;
   said stages in each of said data paths have at least one driving transistor through which a signal for the state associated with the data path can propagate from the input to the output of the circuit; and
   one or more of said stages each have at least one nulling transistor coupled to the driving transistor of the stage separate from the data path of the stage which for each of the data paths null one or more of the driving transistors along the data path after propagating a signal to the output of the circuit.

2. The buffer circuit according to claim 1 further comprising means for synchronously driving the nulling transistors of each stage in each of the data paths to null the driving transistors of the data path after a signal has propagated along the data path to the output of the circuit.

3. The buffer circuit according to claim 1 further comprising a feedback path having a chain of inverters coupled between the output of the circuit and each of the nulling transistors of the circuit in which the output of each successive inverter in the chain is coupled to each of the nulling transistors of each successive stage in the first and second data paths.

4. The buffer circuit according to claim 1 further comprising a feedback path with an inverter to each pair of the nulling transistors of stages having corresponding positions in each of the data paths from the output of the circuit.

5. The buffer circuit according to claim 1 wherein each of said stages having a nulling transistor has another nulling transistor coupled to the driving transistor of the stage.

6. The buffer circuit according to claim 5 further comprising for each of the data paths a chain of inverters coupled between the output of the circuit and each of the another nulling transistors of the data path in which the output of each successive inverter in the chain is coupled to each of the another nulling transistors of each successive stage in the data path.

7. The buffer circuit according to claim 1 wherein the stages in each of the data paths are increasingly larger in size.

8. The buffer circuit according to claim 1 further comprising a capacitive load at the output of the circuit.

9. The buffer circuit according to claim 1 wherein the stages of each of the data paths before the final stage has said least one nulling transistor coupled to the driving transistor of the stage separate from the data path.

10. The buffer circuit according to claim 1 wherein one or more of said stages have dual nulling transistors coupled to the driving transistor of the stage.

11. The buffer circuit according to claim 10 wherein one of said dual nulling transistors of one of said data paths are enabled when no signal is being propagated by said one data path to the output of the circuit.

12. The buffer circuit according to claim 11 wherein the other of said dual nulling transistors of the other of said data paths are enabled when said other data path is propagating a signal to the output of the circuit.

13. The buffer circuit according to claim 1 further comprising:
    a first logic gate to drive said first data path having two inputs wherein a first of the inputs is coupled to the input of the circuit and a second of the inputs is coupled to the output of the circuit; and
    a second logic gate to drive said second data path having two inputs wherein a first of the inputs is coupled to the input of the circuit and a second of the inputs is coupled to the output of the circuit.

14. The buffer circuit according to claim 13 wherein said first logic gate represents a NOR gate, and said second logic gate represents a NAND gate.

15. The buffer circuit according to claim 13 further comprising:
    means have one or more inverters coupled between the input of the circuit and each of said first and second logic gates to reduce parasitic input capacitance of the buffer circuit.

16. The buffer circuit according to claim 13 further comprising:
    means for separating said first and second logic gates to reduce their parasitic capacitance in said circuit.

17. The buffer circuit according to claim 13 wherein said first and second logic gates have a third tristate input.

18. The buffer circuit according to claim 1 wherein a first of the stages in the first data path represents a NAND gate having driving transistors and two nulling transistors coupled to said driving transistors, a first of the stage in the second data path represents a NOR gate having driving transistors and two nulling transistors coupled to said driving transistors, and said buffer circuit further comprises:
    a feedback path having at least one delay element coupled between the output of the circuit and the one of the inputs of each of said NAND and NOR gates.

19. The buffer circuit according to claim 18 wherein said feedback path is further coupled to each of the nulling transistors in the circuit through at least one inverter.

20. The buffer circuit according to claim 18 further comprising a chain of serially connected inverters coupled to the output of the circuit through said delay element in which each successive inverter in said chain has an output to each of the nulling transistors in successive ones of said stages having corresponding position in each of the data paths.

21. The buffer circuit according to claim 18 further comprising:
    means having one or more inverters for driving said first data path and said second data path to reduce parasitic input capacitance of the buffer circuit.

22. The buffer circuit according to claim 18 further comprising:
    means including said first and second input logic gates for reducing the threshold at which said first and second paths detect a transition of their respective state at the input of the buffer circuit.

23. The buffer circuit according to claim 1 wherein the time for each stage of said circuit to propagate a signal is approximately the same.

24. The buffer circuit according to claim 1 wherein the number of stages in each of the data paths is even.

25. The buffer circuit according to claim 1 wherein the number of stages in each of the data paths is odd.

26. The buffer circuit according to claim 1 wherein said driving and nulling transistors are of the CMOS type.

27. The buffer circuit according to claim 1 further comprising an output latch to maintain said output of said circuit.

28. The buffer circuit according to claim 1 further comprising means for tri-stating said output latch.

29. The buffer circuit according to claim 1 wherein a first of the stages in the first data path represents a NAND gate having driving transistors, which represents the two inputs of the NAND gate, and two nulling transistors coupled to said driving transistors, a first of the stage in the second data path represents a NOR gate having driving transistors, which represents the two inputs of the NOR gate, and two nulling transistors coupled to said driving transistors, a series of inverters coupled between one of the inputs of each of the NAND and NOR gates and the other of the inputs of each of the NAND and NOR gates, and said input and output of the circuit are coupled together and connected to a signal line to provide a repeater for signals on the signal line.

30. A repeater to restore distorted data signals having an input and an output comprising:
 a plurality of stages of driving transistors in the direction of input to output of the repeater defining two data paths representing a first data path for a "0" state and a second data path for a "1" state;
 at least one of said stages in each of the data paths has at least one nulling transistor coupled to the driving transistor of the stage separate from the data path which turns off the driving transistor of the next stage in the data path;
 a first logic gate for driving said first data path;
 a second logic gate for driving said second data path; and
 at least one delay element in a feedback path of the output of the repeater to said first and second logic gates, wherein said output of the repeater drives one of a capacitive load and a resistive capacitive load.

31. A repeater for signals on a line having resistance and capacitive which detects at an input of the repeater the rising or falling edge of signals on the line and at an output of the repeater provides an amplification of said detected signals comprising:
 a plurality of stages between the input and output of the repeater defining two data paths representing a first data path for "0" state and a second data path for a "1" state;
 a first of said stages in said first data path represents a NAND gate having driving transistors and nulling transistors coupled to said driving transistors;
 a first of said stages in said second data path represents a NOR gate having driving transistors and nulling transistors coupled to said driving transistors; and
 one or more inverters coupled in series between the input of the repeater and the nulling transistors of the first stage of each of the data paths, wherein the input and output of the repeater are coupled together and connected to said line, and the output of the repeater is tri-stated after the nulling transistors null their associated driving transistors.

32. The repeater according to claim 31 wherein multiple ones of said repeater are connected along said line.

33. The repeater according to claim 31 further comprising means for deriving an internal signal from within the repeater in combination with the input of the repeater to drive the nulling transistor of each of the stages.

34. A CMOS digital buffer circuit having first and second power rails, an input node and an output node comprising:
 first and second data paths each of said data paths having a plurality of successive stages from the input node to the output node of the buffer circuit, and at least one logic gate having at least two inputs and one output, one of the inputs of the logic gate being connected to the input node and the other input of the logic gate coupled to the output node for providing a conditioned signal at the output of the logic gate for the first of the stage is the respective data paths;
 each of said stages other than the final stage in each of said data paths further comprise:
  a driving transistor having a gate, source and drain;
  a fast nulling transistor having a source, gate, and drain;
  a maintenance nulling transistor having a source, gate, and drain, wherein
  the source of the driving transistor of the first stage is connected to the first power rail,
  the gate of the driving transistor is connected to one of the output of the logic gate of the data path associated with the stage when said stage is a first of said stage in the data path, and the drain of the driving transistor of the previous stage in the data path associated with the stage when said stage is after the first stage in the data path,
  the drain of the driving transistor is connected to the drain of each of the nulling transistors and to the gate of the driving transistor of the next stage, and
  the source of each of the fast and maintenance nulling transistors is connected to the second power rail, and the driving transistor and maintenance transistor are connected in an inverter configuration, in which the gate of the maintenance nulling transistor is coupled to the output of the logic gate of the data path associated with the stage, and the output of the said inverter is connected to the drain of the fast nulling transistor and to the gate of the driving transistor of the next stage of the data path associated with the stage; and
 the source of the driving transistor of the final stage of each of said data paths is connected to one of the first and second power rails, and the drain of the driving transistor of the final stage of each of the data paths is connected to the output node.

35. The buffer circuit according to claim 34 wherein each of the stages after the first stage and before the last stage of each of the data paths has the gate of the maintenance nulling transistor coupled to the output of the logic gate of the data path through at least one delay element.

36. The buffer circuit according to claim 34 further comprising a chain of serially connected inverters having an input connected to said output node in which the output of each successive inverter but the last inverter in the chain is connected to the input of the next inverter in the chain and to the gates of the nulling transistor of stages in each data having corresponding positions in their respective data path, whereby each inverter in the chain provides a delay sufficient to activate each of the fast nulling transistor connected there to null the driving transistor associated with the fast nulling transistor such that no DC or short-circuit current is present between the associated nulling and driving transistors.

37. The buffer circuit according to claim 34 further comprising:
 a first chain of serially connected inverters connected to the output of the logic gate of the first data path in which the output of each successive inverter is connected to the input of the next inverter in the chain and to the gate of one of the maintenance nulling transistor of the stages in the first data path; and a second chain of serially connected inverters connected to the output of the logic gate of the second data path in which the output of each successive inverter is connected to the input of the next inverter in the chain and to the gate of one of the maintenance nulling transistor of the stages in the second data path.

38. A method for transmitting a transition in a signal from the input to the output of a buffer circuit having a plurality of amplifying stages having driving transistors defining two alternative data paths from the input to the output of the circuit, said method comprising the steps of:

turning on all the driving transistors in one of the two data paths to propagate a transition in a signal at the input of the buffer circuit to the output of the buffer circuit so that the input and output of the buffer circuit are identical in one of a high state and a low state; and activating a nulling transistor coupled to the driving transistor of one or more of said stages in the data path propagating the signal to turn off the final driving transistor in the data path propagating the signal before the next transition in a signal at the input of buffer circuit is received.

39. The method according to claim 38 wherein said activating step further comprises the step of successively activating the nulling transistors to turn off multiple ones of the driving transistors in the data path propagating the transition in the buffer circuit.

40. The method according to claim 38 further comprising the step of:

providing said nulling transistor in each of said stages before the final transistor in each of said data paths which when the nulling transistor of a stage is activated turns off the driving transistor of the next stage in the data path.

41. The method according to claim 38 further comprising the step of:

providing at least one other nulling transistor to each of the driving transistors before the last stage in each of said data paths which prevent the driving transistors in the data path not propagating the transition in the buffer from effecting the output of the buffer.

42. The method according to claim 38 further comprising the step of:

eliminating the parasitic capacitance of each of the stages in each of the data paths.

43. The method according to claim 38 further comprising the step of:

detecting a slow transition in signal at the input of the buffer circuit.

44. A buffer having an input and an output comprising:
means for connecting said input to said output;
means for sensing any transition of state in a signal at the input of the buffer; and
means coupled to said sensing means for driving the output in the same state as the input and after a delay no longer drives the output of the buffer.

45. A system for transmitting a transition in the state of a data signal through two buffer circuits comprising:

a first buffer circuit having a plurality of stages in the direction of input to output of the circuit defining two data paths representing a first data path for a "1" state and a second data path for a "0" state, said stages in each of said data paths have at least one driving transistor through which a signal for the state associated with the data path can propagate from the input to the output of the first buffer circuit, and one or more of said stages each have at least one nulling transistor coupled to the driving transistor of the stage separate from the data path of the stage which for each of the data paths null one or more of the driving transistors along the data path after propagating a signal to the output of the first buffer circuit;

a second buffer circuit having an input coupled to the output of said first buffer circuit, said second buffer circuit having a plurality of stages in the direction of input to output of the second buffer circuit defining two data paths representing a first data path for a "1" state and a second data path for a "0" state, said stages in each of said data paths have at least one driving transistor through which a signal for the state associated with the data path can propagate from the input to the output of the circuit, and one or more of said stages each have at least one nulling transistor coupled to the driving transistor of the stage separate from the data path of the stage which for each of the data paths null one or more of the driving transistors along the data path after propagating a signal to the output of the second buffer circuit;

a first of the stages in the first data path of said second buffer circuit represents a first logic gate having driving transistors and at least one nulling transistor coupled to said driving transistors, a first of the stage in the second data path of said second buffer circuit represents a second logic gate having driving transistors and at least one nulling transistor coupled to said driving transistors; and said second buffer circuit having means including said first and second input logic gates for reducing the threshold at which said first and second paths detect a transition in the output of the first buffer circuit.

* * * * *